United States Patent
Mitarashi

(10) Patent No.: US 7,095,249 B2
(45) Date of Patent: Aug. 22, 2006

(54) SEMICONDUCTOR INTEGRATED CIRCUIT

(75) Inventor: Mutsumi Mitarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 222 days.

(21) Appl. No.: 10/759,188

(22) Filed: Jan. 20, 2004

(65) Prior Publication Data

US 2004/0262639 A1 Dec. 30, 2004

(30) Foreign Application Priority Data

Jan. 21, 2003 (JP) ............................. 2003-012563

(51) Int. Cl.
*H03K 19/0175* (2006.01)

(52) U.S. Cl. ........................................ 326/81; 326/80
(58) Field of Classification Search ................ 315/160; 326/80, 81

See application file for complete search history.

(56) References Cited

U.S. PATENT DOCUMENTS

| | | | | | |
|---|---|---|---|---|---|
| 5,880,617 | A | * | 3/1999 | Tanaka et al. | 327/333 |
| 6,323,704 | B1 | * | 11/2001 | Pelley et al. | 327/112 |
| 6,353,333 | B1 | * | 3/2002 | Curd et al. | 326/81 |
| 6,366,141 | B1 | * | 4/2002 | Chiba et al. | 327/108 |
| 6,392,439 | B1 | * | 5/2002 | Tanaka et al. | 326/68 |
| 6,483,766 | B1 | * | 11/2002 | Lee | 365/230.06 |
| 6,496,044 | B1 | * | 12/2002 | Nguyen et al. | 327/108 |
| 6,504,400 | B1 | * | 1/2003 | Tanaka et al. | 326/68 |
| 2002/0011883 | A1 | * | 1/2002 | Yamazaki et al. | 327/143 |
| 2002/0050849 | A1 | * | 5/2002 | Hayashi et al. | 327/333 |
| 2002/0118040 | A1 | * | 8/2002 | Salminen | 326/81 |
| 2003/0001628 | A1 | * | 1/2003 | Hsu et al. | 327/103 |

FOREIGN PATENT DOCUMENTS

| | | |
|---|---|---|
| JP | 6-216752 | 8/1994 |
| JP | 3258229 | 10/1997 |

* cited by examiner

*Primary Examiner*—Tuyet Vo
*Assistant Examiner*—Angela M. Lie
(74) *Attorney, Agent, or Firm*—Wenderoth Lind & Ponack, L.L.P.

(57) ABSTRACT

A semiconductor integrated circuit includes a first controlling circuit section, a level transforming circuit, a first buffer circuit, a second buffer circuit, and an overvoltage protecting circuit. A first n-channel type MOS transistor is provided in the first buffer circuit and a second p-channel type MOS transistor is provided in the second buffer circuit. Thus, faster operation can be obtained, and voltage between the source and drain of a third p-channel type MOS transistor and a third n-channel type MOS transistor of the overvoltage protecting circuit, impressed when output signal OUT changes, can be decreased.

14 Claims, 15 Drawing Sheets

SEMICONDUCTOR INTEGRATED CIRCUIT

BACKGROUND OF THE INVENTION

1. Field of the Invention

The present invention relates to a semiconductor integrated circuit equipped with an output circuit for serving as an interface of a digital circuit, which operates with different electricity source voltages.

2. Description of Related Art

The finer the structure of a MOS transistor becomes, the weaker the strength of a gate oxide film becomes. For example, a MOS transistor produced in a fine process of an extent of 0.35 µm, is able to operate with an electricity source voltage of an extent of 3.3V. Further, MOS transistor produced in a latest fine process of an extent of 0.18 µm, is able to operate with an electricity source voltage of an extent of 1.8V. In order to make an interface with a circuit of 0.35 µm fine process, both of a MOS transistor able to be connected with an electricity source voltage of an extent of 1.8V and a MOS transistor able to be connected with an electricity source voltage of an extent of 3.3V are formed in a circuit of 0.18 µm fine process of the conventional art, so as to transform signal level from 1.8V to 3.3V. This the signal level transforming circuit includes an output circuit.

(First Prior Art)

FIG. 13 is a circuit diagram showing a structure of a level transforming circuit of a first prior art disclosed in Japanese patent publication No. 6-216752. This level transforming circuit comprises with MOS transistors which have a dielectric strength of a gate oxide film that is lower than a high voltage (5V), so as to transform level from a low voltage electricity source system to a high voltage electricity source system. As shown in FIG. 13, this level transforming circuit comprises a level transforming section comprising MOS transistors 300 to 313, and an output section comprising MOS transistors 314 to 317. The level transforming section has input there to the signal a IN of low voltage (VCC:3V) electricity source system, so as to output a signal for transforming a level to node N21, N22. The output section has input thereto a control signal from the level transforming section mentioned above, so as to output an output signal OUT1 having an amplitude of 0V to 5V as a signal of a high voltage (VDD:5V) electricity source system, an output signal OUT2 having an amplitude of an intermediate electric potential to 5V as a signal of the same, and an output signal OUT3 having an amplitude of 0V to an intermediate electric potential as a signal of the same.

Here, described is an occasion when an output enable signal OE and its inverse signal OEB are inputted with the H level and the L level respectively. If input signal IN becomes the L level, PMOS 306, 307 turns on and NMOS 305, 312 turns off. As a result, node N23, N24 becomes the H level, and NMOS 304 turns on. Then, a source electric potential of NMOS 302 decreases, and a route of current comprised of NMOS 302, PMOS 301 is taken. On the other hand, node N25 is pulled down, and, PMOS 308 turns on. When PMOS 308 turns on, node N21 becomes the H level, and, PMOS 309 turns on. Then, drain electric potential of NMOS 310 is pulled up to the high voltage VDD. Moreover, when node N24 becomes the H level, NMOS 311 is on, because the output enable signal EB is the H level. Then, node N22 becomes H level, and output signal OUT3 becomes 0V. When node N21 becomes the H level, PMOS 314 turns off, and output signal OUT2 becomes an intermediate electric potential. Output signal OUT1 becomes 0V, as NMOS 316 turns on, because output signal OUT3 is 0V.

On the other hand, if input signal IN becomes H level, NMOS 305, 312 turns on and PMOS 306, 307 turns off. Then, the electric potential of nodes N22, N23 are pulled down, and NMOS 317 turns off. Since NMOS 311 is on, node N24 is pulled down, and a route of current comprised of PMOS 309, NMOS 310 is taken, and PMOS 314 turns on, when node N21 is pulled down, and PMOS 300 turns on, so as to pull up node N25, Output signal OUT1 becomes 5V, output signal OUT2 becomes 5V, and output signal OUT3 becomes an intermediate electric potential.

(Second Prior Art)

FIG. 14 is a circuit diagram showing a structure of a level transforming circuit of a second prior art disclosed in Japanese patent No. 3258229. This level transforming circuit comprises MOS transistors which have a dielectric strength of gate oxide film that is lower than a high voltage (5V), so as to transform a level from a low voltage electricity source system to a high voltage electricity source system, similar to the first prior art. As shown in FIG. 14, this level transforming circuit comprises CMOS circuit 410, intermediate circuit 430, 440, and CMOS circuit 420.

CMOS circuit 410 comprises PMOS 411, 412 and NMOS 413, 414. PMOS 411, 412 are connected in series between the high voltage electricity source (VDD: 5V) and output node N1. NMOS 413, 414 are connected in series between the node N1 and the ground. The gate of PMOS 411 for pulling up is connected with node N4. On the other hand, the gate of NMOS 414 for pulling down has input thereto inputted with a signal IN which amplitude is between a low voltage (VCC:3V) and the ground. On the other hand, each gate of PMOS 412 and NMOS 413 is impressed with the low voltage in common.

The intermediate circuit 430 comprises PMOS 431, 432. PMOS 431 is connected between the high voltage electricity source VDD and output node N3, and its gate is connected with node N4. On the other hand, PMOS 432 is connected between node N3 and the low voltage electricity source VCC. and its gate is connected with output node N1 of CMOS circuit 410.

The intermediate circuit 440 comprises PMOS 441, 442. PMOS 441 is connected between the high voltage electricity source VDD and output node N4, and its gate is connected with node N3. On the other hand, PMOS 432 is connected between node N4 and the low voltage electricity source VCC, and its gate is impressed with output signal OUT1.

CMOS circuit 420 comprises PMOS 421, 422 and NMOS 423, 424. PMOS 421, 422 are connected in series between the high voltage electricity source VDD and output node N2. NMOS 423, 424 are connected in series between the output node N2 and the ground. The gate of PMOS 421 for pulling up is connected with node N3. On the other hand, the gate of NMOS 424 for pulling down, is inputted with an inverse signal of the input signal IN. On the other hand, each gate of PMOS 422 and NMOS 423 is impressed with the low voltage VCC in common.

Hereafter, the operation of this circuit is described.

When the input signal IN is the low voltage level VCC, NMOS 414 turns on, and PMOS 432 turns on. As a result, PMOS 441, 421 turn on. On the other hand, NMOS 424 turns off by the inverse signal of the input signal, and PMOS 442 turns off. Therefore, an output signal of the high voltage level VDD is output to OUT1. In this state, direct current does not pass through the circuit, because PMOS 411, 431, 442 and NMOS 424 are in the off state.

On the other hand, when the input signal changes from the low voltage level VCC to the ground level (0V level), NMOS 424 turns on, and PMOS 442 turns on. As a result, PMOS 411, 431 turn on, and NMOS 414 turns off by the inverse signal of the input signal. Then, PMOS 432 turns off. Therefore, an output signal of the ground level (0V level) is output. In this state, direct current does not pass through the circuit, because PMOS 421, 441, 432 and NMOS 414 are in the off state.

FIG. 15 is a circuit diagram showing the structure of a three state output circuit equipped with the level transforming circuit mentioned above. The logic circuit of the low voltage electricity source system has a data terminal 451 and an enable terminal 452, and it comprises a NAND gate 453, inverters 454, 455, and a NOR gate 456. Further, with the output side of said level transforming circuit, connected is a pre-buffer circuit 460, and with this, connected is a main buffer circuit 470. The pre-buffer circuit 460 comprises PMOS 461, 462, and it provides PMOS 471 with a signal having an amplitude between the high voltage VDD and the low voltage VCC. On the other hand, the main buffer circuit 470 comprises PMOS 471, 472 and NMOS 473, 474, and outputs an output signal OUT from an output pad 480 to the outside of the integrated circuit.

When the ground level 0V is inputted to the enable terminal 452, the high voltage level VDD is impressed with the gate of PMOS 471 and the ground level 0V is impressed with the gate of NMOS 474. Then, the output signal OUT becomes a high impedance state.

On the other hand, when the low voltage level VCC is impressed with the enable terminal 452 and the low voltage level VCC is impressed with the data terminal 451, the low voltage level VCC is impressed with the gate of PMOS 471 and the ground level 0V is impressed with the gate of NMOS 474. Then, the output signal OUT becomes the high voltage level VDD.

Moreover, when the low voltage level VCC is impressed with the enable terminal 452 and the ground level 0V is impressed with the data terminal 451, the high voltage level VDD is impressed with the gate of PMOS 471 and the low voltage level VCC is impressed with the gate of NMOS 474. Then, the output signal OUT becomes the ground level 0V. Therefore, the three state buffer circuit functions.

However, the output circuit of the conventional art mentioned above has the following problems.

Transistors operating with the low voltage electricity source and transistors having a gate oxide film strength stronger than the voltage level VDD of high voltage electricity source, must be formed together. Therefore, the gate oxide films of some transistors must be thick and their gate length must be long, and this kind of MOS transistors available for the output circuit, must be formed partially on some portions of an integrated circuit on a semiconductor chip. Thus, there is a problem that the manufacturing process becomes complicated.

Moreover, as for the first prior art (FIG. 13), an output circuit is able to comprise only transistors having a gate oxide film strength lower than the high voltage level VDD. However, the first prior art limits the amplitude of a gate voltage (node N21) of PMOS 314, by using the effect of turning off PMOS 309, so as to restrain the gate voltage under the strength of gate oxide film less than the high voltage level VDD. Meanwhile, the gate of PMOS 309 is impressed with an electric potential VB. Therefore, the electric potential of the gate of PMOS 309 does not decrease less than VB+Vth, even if a logical value of node N21 is the L level. Here, Vth is threshold voltage of PMOS.

While PMOS 309 is turning off, the electric potential of node N1 gradually comes to VB+Vth. The level transforming circuit of the first prior art uses this motion. Thus, there is a problem that it cannot operate rapidly.

Moreover, the gate voltage of PMOS 314 (electric potential of node N21) becomes VDD−(VB+Vth). So, if (VB+Vth) is higher than 3V, the gate voltage becomes a low value. Therefore, there is another problem that the ability to a bear load of the output section decreases. Moreover, the output signal OUT1 rises to 5V from 0V, when NMOS 317 turns off and PMOS 314 turns on. In this occasion, the source electric potential of PMOS 315 is pulled up rapidly. Therefore, the voltage Vgs between gate and source of PMOS 315 becomes certain voltage, so that the current flowing in PMOS 315 is equal to the current flowing in PMOS 314. So, between the source and drain of PMOS 315, voltage of VCC+Vgs is impressed. Similarly, output signal OUT1 drops to 0V from 5V, when PMOS 314 turns off and NMOS 317 turns on. In this occasion, the source potential of NMOS 316 is pulled down rapidly. Therefore, the voltage Vgs between the gate and source of NMOS 316 becomes a certain voltage, so that the current flowing in NMOS 316 is equal to the current flowing in NMOS 317. So, between source and drain of NMOS 316, voltage of VCC+Vgs is impressed. Therefore, voltage exceeding the voltage preferred in a low voltage electricity source system, is transiently impressed between the source and drain. Thus, the ability of the device is deteriorated by a hot carrier. As a result, a problem is caused that the reliability of the device deteriorates.

Moreover, as for second prior art (FIG. 14, 15), an output circuit is able to comprise only transistors having a gate oxide film strength lower than the high voltage level VDD, as well. However, the second prior art has the following problem.

When the enable terminal 452 is impressed with the low voltage level VCC, the data terminal 451 becomes the ground level VCC from the low voltage level VCC. In this occasion, the gate voltage of PMOS 471 becomes the high voltage level VDD from the low voltage level VCC, and the gate voltage of NMOS 474 becomes the low voltage level VCC from the ground level. As a result, the output signal OUT becomes the ground level from the high voltage level VDD. In this occasion, in order to bear a load connected to the output pad 480, the voltage between the source and drain of NMOS 473 becomes VDD−VCC+Vgs. Here, Vgs is the gate source voltage of NMOS 474, which flows current in NMOS 473 the same as current flowing in NMOS 474. So, the voltage between the source and drain transiently becomes higher than VCC. Similarly, the voltage between the gate and source of PMOS 472 becomes VCC+Vgs. Here, Vgs is gate source voltage of PMOS 472, which flows current in PMOS 472 the same as current flowing in PMOS 471. So, the voltage between the source and drain transiently becomes higher than VCC. Therefore, voltage exceeding the voltage preferred in low voltage electricity source system, is transiently impressed between source and drain. Moreover, voltage exceeding the voltage preferred in a low voltage electricity source system, is transiently impressed between the gate and source. Thus, the ability of the device is deteriorated by a hot carrier. As a result, a problem is caused that the reliability of the device deteriorates.

Moreover, with dropping of output node N3, output node N2 is pulled up by the turning on current of PMOS 421 flowing through PMOS 422. As shown in FIG. 15, a buffer to drive succeeding output stage is provided to the level transforming circuit. This buffer comprises two PMOS 461, 462, which are connected in series between the high voltage electricity source VDD and the low voltage electricity source VCC. The source of PMOS 461 is connected with the high voltage electricity source VDD. The drain of PMOS 462 is connected with the low voltage electricity source VCC. The gate of PMOS 461 is connected with output node N3. The gate of PMOS 462 is connected with output node N2. Therefore, PMOS 461 comes into on state, while PMOS 462 is still in on state. Therefore, passing current flows from the high voltage electricity source VDD to the low voltage electricity source VCC. As a result, a problem is caused of increasing electricity consumption in vain.

Moreover, as described in Japanese patent 3258229, in the occasion when the output stage of a semiconductor integrated circuit is driven, each transistor of the output stage usually has a gate width of several hundreds μm. So, as for gate the width of each transistor of a buffer driving this transistor of the output stage, if it is narrower than several hundreds μm, current flowing through the output stage decreases. As a result, a problem is caused of decreasing the drivability of the output stage.

The present invention is aimed at providing a novel and improved semiconductor integrated circuit, which is able to operate fast and to restrain drivability drop, so as to solve the problems contained in the semiconductor integrated circuit of the prior art mentioned above.

SUMMARY OF THE INVENTION

According to the first aspect of the present invention, provided is: a semiconductor integrated circuit is provided comprising a first controlling circuit section (50), a level transforming circuit (11a), a first buffer circuit (20), a second buffer circuit (40), and an overvoltage protecting circuit (70).

A first controlling circuit section (50) has input thereof an input signal having an amplitude between a low voltage and the ground, operates with an electricity source of the low outputs a first control signal generated by the input signal, outputs an inverse signal of the first control signal, and outputs a second control signal generated from the first control signal.

A level transforming circuit (11a) is inputted with the first control signal, inputted with the inverse signal, outputs a first signal having an amplitude between the low voltage and a high voltage higher than the low voltage.

A first buffer circuit (20) has a first p-channel type MOS transistor connected between an electricity source of high voltage and a first output node, wherein a gate of the first p-channel type MOS transistor is impressed with the first signal, and has a first n-channel type MOS transistor connected between the first output node and the electricity source of the low voltage, wherein a gate of the first n-channel type MOS transistor is impressed with the first signal, and the first buffer circuit outputs a second signal having an amplitude between the high voltage and the low voltage to the first output node.

A second buffer circuit (40) has a second p-channel type MOS transistor connected between the electricity source of low voltage and the second output node, wherein a gate of the second p-channel type MOS transistor is impressed with the second signal, and has second n-channel type MOS transistor connected between the second output node and the ground, wherein a gate of the second n-channel type MOS transistor is impressed with the second signal, and the second buffer circuit outputs a third signal having amplitude between the low voltage and the ground to the second output node.

An overvoltage protecting circuit (70) has a drain of a third p-channel type MOS transistor connected with a third output node, wherein a source of the third p-channel type MOS transistor is impressed with the second signal, and has a drain of the third n-channel type MOS transistor connected with the third output node, wherein a source of the third n-channel type MOS transistor impressed with the third signal, and each gate of said third p-channel type MOS transistor and the third n-channel type MOS transistor is impressed with the low voltage in common, and outputs a fourth signal having a amplitude between the high voltage and the ground to the third output node.

According to the above configuration, the electric potential exceeding the low voltage level is not statically impressed with the gate oxide film of each transistor. Therefore, a semiconductor integrated circuit is able to comprise only a MOS transistor whose endurable strength of a gate oxide film is lower than the high voltage electricity source level. Besides, first n-channel type MOS transistor (22) of first buffer circuit (20) and second p-channel type MOS transistor (41) of second buffer circuit (40) are provided, in comparison with the output stage of the prior art (FIG. 13 and FIG. 15). Therefore, a faster operation becomes possible, and the voltage between the source and drain of third p-channel type MOS transistor (71) and third n-channel type MOS transistor (72) of overvoltage protecting circuit (70) impressed when the output signal OUT changes, can be decreased.

Moreover, the semiconductor integrated circuit of the first aspect comprises a pre-buffer circuit (30) connected with the output of the level transforming circuit (11a), operating with an electricity source of voltage between the high voltage and the low voltage, so as to output said first signal having an amplitude between the high voltage and the low voltage. This pre-buffer circuit (30) can adjust timing of inputting the first buffer circuit with the first signal.

According to the above configuration, the pre-buffer circuit (30) comprises CMOS inverter. On the other hand, the first prior art mentioned above (FIG. 13) employs an effect of turning off the source follower transistor, in order to limit the amplitude of gate voltage. Therefore, the first aspect of present invention is able to operate faster than the first prior art and to restrain drivability drop. Moreover, the pre-buffer circuit is inserted in the stage before the first buffer circuit. Therefore, the on-off timing of first buffer circuit (20) can be set corresponding to the off-on timing of second buffer circuit (40). So, current passing through the overvoltage protecting circuit (70) from the high voltage electricity source to the ground, can be decreased.

According to the second aspect of the present invention, provided is: a semiconductor integrated circuit is provided comprising a first controlling circuit section (50), a first level transforming circuit (11), a second level transforming circuit (12), a first buffer circuit (20), a second buffer circuit (40), an overvoltage protecting circuit (70).

A first controlling circuit section (50) has input thereto with a data input signal having amplitude between a low voltage and the ground and an enable signal, operates with an electricity source of the low voltage outputs a first control signal generated by said data input signal and said enable signal, outputs a first inverse signal of the first control signal, outputs a second control signal generated by the data input signal and the enable signal, outputs a second inverse signal of the second control signal, outputs a third control signal generated from the first control signal, and outputs a fourth control signal generated from the second control signal.

A first level transforming circuit (11) has input thereto the first control signal and first inverse signal, and outputs a first signal having an amplitude between the low voltage and a high voltage higher than the low voltage.

A second level transforming circuit (12) has input thereto the second control signal, and the second inverse signal, outputs a second signal having an amplitude between the low voltage and a high voltage higher than said low voltage.

A first buffer circuit (20) has a gate of the first p-channel type MOS transistor impressed with the first control signal, connected between an electricity source of the high voltage and first output node, and has a gate of the first n-channel type MOS transistor impressed with the second control signal, connected between first output node and the ground, and the first buffer circuit (20) outputs a third signal having an amplitude between the high voltage and the low voltage to the first output node.

A second buffer circuit (40) has a gate of the second p-channel type MOS impressed with the third control signal, connected between the electricity source of the low voltage and the second output node, and has a gate of the second n-channel type MOS transistor impressed with the fourth control signal, connected between the second output node and the ground, and the said second buffer circuit (40) outputs a fourth signal having an amplitude between the low voltage and the ground to the second output node.

An overvoltage protecting circuit (70) has a source of the third p-channel type MOS transistor impressed with the the third signal, a drain of the third p-channel type MOS transistor connected with the third output node, and has a source of the third n-channel type MOS transistor impressed with the fourth signal, a drain of the third n-channel type MOS transistor connected with third output node, and each gate of the third p-channel type MOS transistor and the third n-channel type MOS transistor impressed with the low voltage in common, and outputs a fifth signal having an amplitude between the high voltage and the ground to the third output node.

According to the above configuration, obtained is a tri-state output circuit is obtained having the same effect as the semiconductor integrated circuit according to the first aspect mentioned above. Further, when the output is in a high impedance state, if the output is impressed with the high voltage level or ground level, voltage clamped by the overvoltage protecting circuit (70) appears at node N6. Therefore, it is possible to provide a common circuit for input and output by attaching node N6 with an input circuit operating with a low voltage electricity source.

Further, each gate of first buffer circuit (20) and second buffer circuit (40) is driven by different signals respectively. Therefore, by adjusting the timing, it is possible to decrease a passing current. Thus, a tri-state output circuit with lower electricity consumption is realized.

Moreover, the semiconductor integrated circuit of the first aspect comprises a pre-buffer circuit (30) connected with the output of the level transforming circuit (11), operating with the electricity source of voltage between the high voltage and the low voltage, so as to output the first signal having an amplitude between the high voltage and the low voltage. This pre-buffer circuit (30) can adjust timing of inputting the first buffer circuit with the first signal (claim 10).

According to the above configuration, the pre-buffer circuit (30) comprises a CMOS invertor. On the other hand, the first prior art mentioned above (FIG. 13) employs an effect of turning off the source follower transistor, in order to limit amplitude of gate voltage. Therefore, the first aspect of present invention is able to operate faster than the first prior art and to restrain drivability drop. Moreover, the pre-buffer circuit is inserted in the stage before the first buffer circuit. Therefore, the on-off timing of first buffer circuit (20) can be set corresponding to the off-on timing of second buffer circuit (40). So, current passing through the overvoltage protecting circuit (70) from the high voltage electricity source to the ground can be decreased.

In the semiconductor integrated circuit of first and second aspect, the following adaptation is possible.

Turning on resistance of first p-channel type MOS transistor (21) in first buffer circuit (20) is set higher than turning on resistance of third p-channel type MOS transistor (71) of overvoltage protecting circuit (70), and turning on resistance of second n-channel type MOS transistor (42) in second buffer circuit (40) is set higher than turning on resistance of third n-channel type MOS transistor (72) of overvoltage protecting circuit (70).

According to the above structure, even in transient state, voltage exceeding the dielectric strength between the source and drain is not impressed between the source and drain of each MOS transistor. Therefore, a semiconductor integrated circuit is able to comprise only a MOS transistor whose endurable dielectric strength between source and drain is lower than the high voltage electricity source. Moreover, even in transient state, voltage exceeding the low voltage level is not impressed to the gate oxide film of each transistor mentioned above. Therefore, a semiconductor integrated circuit with higher reliability is able to comprise only a MOS transistor whose endurable dielectric strength is lower than the high voltage electricity source.

Moreover, substrates of first n-channel type MOS transistor (22) in first buffer circuit (20) and third n-channel type MOS transistor (72) of overvoltage protecting circuit are connected with each source, so as to isolate them from substrates of the other n-channel type MOS transistor (second n-channel type MOS transistor etc.).

According to the above structure, first n-channel type MOS transistor (22) and third n-channel type MOS transistor (72) are formed in a p-well region isolated electrically from the substrate, and each substrate is connected with source. Thus, an effect is obtained that the load to gate oxide films of first and third n-channel type MOS transistors (22, 72), further decreases. Moreover, an inverse bias voltage impressed to the pn junction formed between the drain and substrate of first and third n-channel type MOS transistors (22, 72) is able to decrease. Moreover, an faster circuit operation, is expected because the substrate bias effect of first n-channel type MOS transistors (22) does not influence the operation of the circuit.

Moreover, the substrate of third p-channel type MOS transistor (71) of the overvoltage protecting circuit (70) is connected with the source, so as to isolate the substrate from substrates of the other p-channel type MOS transistor (first or second p-channel type MOS transistor (21, 41) etc.).

According to the above structure, third p-channel type MOS transistor (71) is isolated from the n-well of the other PMOS, and, each substrate is connected with the source. Thus, an effect is obtained that the load to the gate oxide films of third p-channel type MOS transistors (71) further decreases. Moreover, the inverse bias voltage impressed to the pn junction formed between the drain and substrate of third p-channel type MOS transistors (71) is able to decrease.

Moreover, each p-channel type MOS transistor and each n-channel type MOS transistor can be formed on an active region isolated by an insulating film.

According to the above structure, an effect is obtained that passing current is small and fast output circuit is realized.

Moreover, the first signal is a signal having an amplitude between the high voltage and the low voltage, and the first signal is output independently of the output signal. According to the above structure, operation can be fast and drop of load drivability can be restrained. Moreover, an range of adaptation of level transforming circuit becomes wide.

Moreover, according to the other aspect of the present invention, in a semiconductor circuit comprising a low voltage system circuit which is connected between the low voltage electricity source and the ground and which outputs a signal having an amplitude between the low voltage and the ground voltage, and a level transforming circuit transforming signal output from the low voltage system circuit into a signal having an amplitude between the high voltage higher than the low voltage and the ground voltage, the level transforming circuit is formed according to each of the above first to third aspect.

Incidentally, in the above description, elements designated with symbols in parentheses are for ease understanding the invention. Such symbols do not limit the scope of present invention.

BRIEF DESCRIPTION OF THE DRAWINGS

The present invention will be understood more fully by the succeeding detailed description in conjunction with the following accompanying drawings.

DESCRIPTION OF THE PREFERRED EMBODIMENTS

The preferred embodiment will be described with reference to the accompanying drawings hereafter. Incidentally, in this application and accompanying drawings, as for plural elements having the same function and structure in substance, the same plural elements are designated with the same symbols, so as to omit the same description.

<Embodiment 1>

Figure 1:
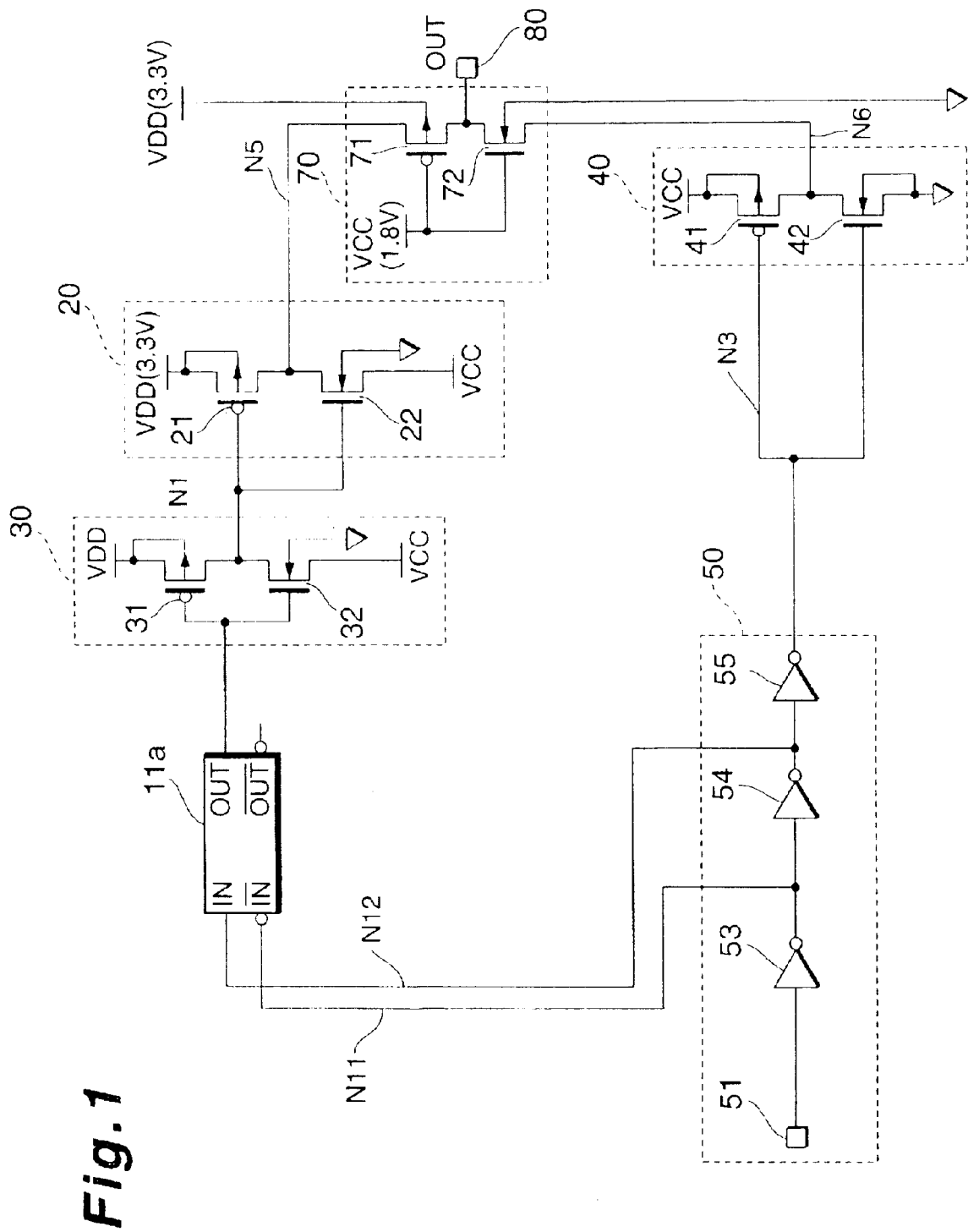
FIG. 1 is a circuit diagram showing an output circuit according to Embodiments 1 and 2.

FIG. 1 is a circuit diagram showing an output circuit according to Embodiment 1.

This output circuit comprises, as shown in FIG. 1, a logic circuit 50 (an example of the first control circuit section of present invention), a level transforming circuit 11a (an example of the level transforming circuit of present invention), a pre-buffer circuit 30 (an example of the pre-buffer circuit of present invention), a main buffer circuit 20 (an example of the first buffer circuit of present invention), a main buffer circuit 40 (an example of the second buffer circuit of present invention), an overvoltage protecting circuit 70 (an example of the overvoltage protecting circuit of present invention). Hereafter, each element is described in this order.

(Logic Circuit 50)

Figure 2:
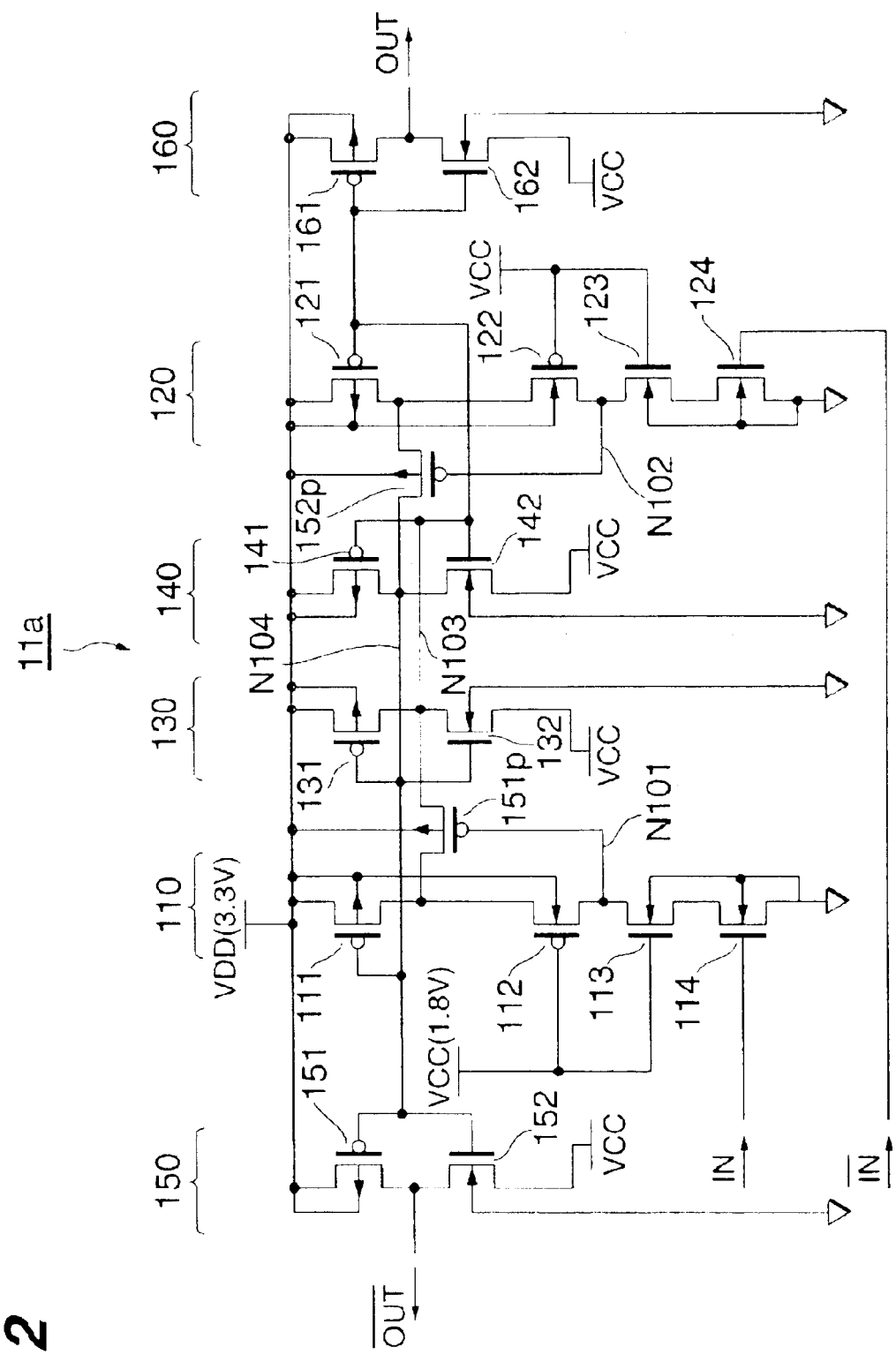
FIG. 2 is a circuit diagram showing a level transforming circuit equipped with the output circuit of FIG. 1.

The logic circuit 50 of the low voltage electricity source system has a data terminal 51. The logic circuit 50 comprises inverters 53, 54, 55. Some outputs of this logic circuit 50 are connected with the level transforming circuit 11a which structure is shown in FIG. 2. Moreover, another output of logic circuit 50 is connected with the main buffer circuit 40.

(Level Transforming Circuit 11a)

The level transforming circuit 11a has input thereto the output of logic circuit 50, and it is transformed into a signal of amplitude between the high voltage VDD and the low voltage VCC, so as to output. Further the output of level transforming circuit 11a, is connected to a pre-buffer circuit 30. Connected to pre-buffer circuit 30 is a main buffer circuit 20.

(Pre-Buffer Circuit 30)

The pre-buffer circuit 30 comprises PMOS 31 and NMOS 32, and it provides gates of PMOS 21 and NMOS 22 of main buffer circuit 20 with a signal of an amplitude between the high voltage VDD and the low voltage VCC.

(Main Buffer Circuit 20)

The main buffer circuit 20 comprises PMOS 21 and NMOS 22, and it provides the overvoltage protecting circuit 70 with an output signal of an amplitude between the high voltage VDD and the low voltage VCC.

(Main Buffer Circuit 40)

The main buffer circuit 40 comprises PMOS 41 and NMOS 42, and it provides one of the terminals of overvoltage protecting circuit 70 with an output signal of an amplitude between the ground level 0V and the low voltage VCC.

(Overvoltage Protecting Circuit 70)

The output signal OUT is output from overvoltage protecting circuit 70 to the outside of the integrated circuit by way of an output pad 80. The over voltage protecting circuit 70 it comprises PMOS 71 and NMOS 72, whose gates are impressed the low voltage level in common, and whose drains are connected with each other.

In the structure mentioned above, the pre-buffer circuit 30 comprises an inverter, and the substrate (n-type well region) of PMOS 31 is connected with the high voltage electricity source VDD. Besides, the substrate of NMOS 32 is connected with the ground. Similarly, main buffer circuit 20 comprises an inverter, and the substrate (n-type well region) of PMOS 21 is connected with the high voltage electricity source VDD. Besides, the substrate of NMOS 22 is connected with the ground. Moreover, the main buffer circuit 40 comprises an inverter, and the substrate (n-type well region) of PMOS 41 is connected with the low voltage electricity source VCC. Besides, the substrate of NMOS 42 is connected with the ground. The overvoltage protecting circuit 70 comprises an inverter, and the substrate (n-type well region) of PMOS 71 is connected with the high voltage electricity source VDD. Besides, the substrate of NMOS 72 is connected with the ground.

(Level Transforming Circuit 11a)

FIG. 2 is a circuit diagram showing a structure of the level transforming circuit 11a.

The level transforming circuit 11a, as shown in FIG. 2, comprises an inverter 150, CMOS circuit 110, an intermediate circuit 130, an intermediate circuit 140, CMOS circuit 120, PMOS 151p, and PMOS 152p. Hereafter, these are described in this order.

(Inverter 150)

The inverter 150 has PMOS 151 and NMOS 152. PMOS 151 is connected between the high voltage electricity source VDD and an output signal /OUT, and its gate is connected with node 104. NMOS 152 is connected between the output signal /OUT and the low voltage electricity source VCC, and its gate is connected with node 104.

(CMOS Circuit 110)

CMOS circuit 110 has PMOS 111, 112 and NMOS 113, 114. PMOS 111, 112 are connected in series, and this series circuit is connected between a high voltage electricity source VDD (3.3V for example) and an output node N101. NMOS 113, 114 are connected in series, and this series circuit is connected between the output node N101 and the ground. Besides, PMOS 111 has its gate connected with a node N104, so as to function as a pull up switch. On the other hand, NMOS 114 has its gate connected with an input signal IN having an amplitude between a low voltage VCC (1.8V for example) and the ground, so as to function as a pull down switch. On the other hand, PMOS 112 and NMOS 113 have their gates impressed with the low voltage VCC in common.

(Intermediate Circuit Inverter 130)

The intermediate circuit inverter 130 has PMOS 131 and NMOS 132. PMOS 131 is connected between the high voltage VDD and an output node N103, and its gate is connected with the node N104. NMOS 132 is connected between the output node N103 and the low voltage VCC. And, its gate is connected with the node N104.

(Intermediate Circuit Inverter 140)

The intermediate circuit inverter 140 has PMOS 141 and NMOS 142. PMOS 141 is connected between the high voltage VDD and the output node N104, and its gate is connected with the node N103. NMOS 132 is connected between the output node N104 and the low voltage VCC. And, its gate is connected with the node N103.

(CMOS Circuit 120)

CMOS circuit 120 has PMOS 121, 122 and NMOS 123, 124. PMOS 121, 122 are connected in series, and this series circuit is connected between the high voltage electricity source VDD and the output node N102. NMOS 123, 124 are connected in series, and this series circuit is connected between the output node N102 and the ground. Besides, PMOS 121 gets its gate connected with a node N103, so as to function as a pull up switch. On the other hand, NMOS 124 has its gate connected with an inverse signal /IN of input signal IN, so as to function as a pull down switch. On the other hand, PMOS 122 and NMOS 123 have their gates impressed with the low voltage VCC in common.

(Inverter 160)

The inverter 160 has PMOS 161 and NMOS 162. PMOS 161 is connected between the high voltage electricity source VDD and the output signal OUT, and its gate is connected with node 103. NMOS 162 is connected between the output signal OUT and the low voltage electricity source VCC. And, its gate is connected with node 103.

(PMOS 151p)

PMOS 151p has its gate connected with the node N101 of CMOS circuit 110, and its drain is connected with the source of PMOS 112 of CMOS circuit 110. Besides, its source is connected with the node N103.

(PMOS 152p)

PMOS 152p has its gate connected with the drain of PMOS 122 of CMOS circuit 120, and its drain is connected with the source of PMOS 122 of second CMOS circuit 120. Besides, its source is connected with the node N104.

In the configuration mentioned above, the intermediate circuit inverters 130, 140 comprise a latch circuit, and to this latch circuit, writing of data is performed by way of PMOS 151p, 152p. PMOS 112 and NMOS 113 of CMOS circuit 110 are provided so as to act as an overvoltage protector of PMOS 111 and NMOS 114 respectively, and both gates of PMOS 112 and NMOS 113 are impressed with the low voltage electricity source VCC in common. A substrate (N type well region) of PMOS 111 and a substrate of PMOS 112 are connected with the high voltage electricity source VDD in common. Besides, a substrate of NMOS 113 and a substrate of NMOS 114 are connected with the ground in common.

Similarly, PMOS 122 and NMOS 123 of CMOS circuit 120 are provided so as to act as an overvoltage protector of PMOS 121 and NMOS 124 respectively, and both gates of PMOS 122 and NMOS 123 are impressed with the low voltage electricity source VCC in common. A substrate (N type well region) of PMOS 121 and a substrate of PMOS 122 are connected with the high voltage electricity source VDD in common. Besides, a substrate of NMOS 123 and a substrate of NMOS 124 are connected with the ground in common.

Moreover, a substrate of PMOS 131 of intermediate circuit inverter 130 is connected with the high voltage electricity source VDD, and a substrate of NMOS 132 is connected with the ground.

Similarly, a substrate of PMOS 141 of intermediate circuit inverter 140 is connected with the high voltage electricity source VDD, and a substrate of NMOS 142 is connected with the ground.

Moreover, substrates of PMOS 151p and PMOS 152p are connected with the high voltage electricity source VDD respectively.

Moreover, a substrate of PMOS 151 of inverter 150 is connected with the high voltage electricity source VDD, and a substrate of NMOS 152 is connected with the ground.

Similarly, a substrate of PMOS 161 of inverter 160 is connected with the high voltage electricity source VDD, and a substrate of NMOS 162 is connected with the ground.

The operating voltage of each PMOS transistor and NMOS transistor mentioned above is limited by the dielectric strength of their gate oxide film within the scope of more than VCC and more than VDD−VCC and less than VDD. In the description mentioned below, it is provided that a relation of VDD>VCC>=VDD−VCC maintained. Moreover, the inverse bias strength of the pn junction between the diffusing region and substrate of each PMOS transistor and NMOS transistor is set higher than the high voltage VDD.

<Operation of Embodiment 1>

When the data terminal 51 is impressed with the low voltage level VCC, output node N11 of inverter 53 becomes the ground level 0V. The inverter 54 provides the output node N12 with the low voltage level VCC. The input IN and /IN (the inverse signal of IN) of level transforming circuit 11a are connected with the node N12 and N11 respectively, and the high voltage level VDD is provided to the output of level transforming circuit 11a. The output node N1 of pre-buffer circuit 30 becomes the low voltage level VCC, and the inverter 55, whose input is connected with the node N12, brings its output node N3 to the ground level 0V. The PMOS 21 of main buffer circuit 20 turns on, and NMOS 22 of it turns off. The PMOS 41 of main buffer circuit 40 turns on, and NMOS 42 of it turns off. The PMOS 71 of overvoltage protecting circuit 70 turns on, and NMOS 72 of it turns off. Therefore, the output signal OUT becomes the high voltage level VDD.

On the other hand, when the data terminal 51 is impressed with the ground level 0V, the output node N11 of inverter 53 becomes the low voltage level VCC. The inverter 54 provides the output node N12 with the ground level 0V. The low voltage level VCC is provided to the output of level transforming circuit 11a. The output node N1 of pre-buffer circuit 30 becomes the high voltage level VDD, and the inverter 55, whose input is connected with the node N12, brings its output node N3 to the low voltage level VCC. The PMOS 21 of main buffer circuit 20 turns off. And, NMOS 22 of it turns on. The PMOS 41 of main buffer circuit 40 turns off, and NMOS 42 turns on. The PMOS 71 of overvoltage protecting circuit 70 turns off. And, NMOS 72 of it turns on. Therefore, the output signal OUT becomes the ground level 0V.

Therefore, the output circuit of FIG. 1 functions as an output circuit, which transforms a signal of amplitude between the ground level 0V and the low voltage level VCC into a signal of amplitude between the ground level 0V and the high voltage level VDD.

PMOS 41 of main buffer circuit 40 accelerates the rising of output signal OUT by way of NMOS 72 of the overvoltage protecting circuit 70, when the output signal OUT shifts from the ground level 0V to the high voltage level VDD. Moreover, PMOS 41 of main buffer circuit 40 accelerates the falling of output signal OUT by way of PMOS 71 of the overvoltage protecting circuit 70, when the output signal OUT shifts from the high voltage level VDD to the ground level 0V.

In the operation mentioned above, voltage higher than the low voltage level VCC is never impressed between the gate and the source or drain of each MOS transistor. Moreover, between the gate and the substrate, voltage higher than the low voltage level VCC is never impressed, except NMOS 22, 32. When a channel is formed as MOS transistor is, the channel is in the same electric potential as the source. Thus, the voltage between source and substrate is not impressed to the gate oxide film. Only the voltage between the gate and source is impressed to the gate oxide film.

On the other hand, when a channel is not formed as MOS transistor is off, total voltage Vgs+Vsb consisting of gate source voltage Vgs and source substrate voltage Vsb is divided between the gate oxide film and depletion layer beneath the gate. The depletion layer extends as Vsb increases, and the voltage impressed to the gate oxide film does not increase so much. With the reason mentioned above, even if Vsb is impressed, the maximum voltage impressed to the gate oxide film is not different from the conventional art. Thus, reliability of gate oxide film is never deteriorated.

<Effect of Embodiment 1>

As mentioned above, according to Embodiment 1, the gate oxide film of each transistor mentioned above is not impressed with an electric potential exceeding the low voltage level statically. Therefore, a level transforming circuit can comprise a MOS transistor which acceptable dielectric strength of a gate insulating film is lower than the high voltage level. Besides, the pre-buffer circuit comprises a CMOS inverter. Thus, the output circuit of present invention operates faster than the first prior art (FIG. 13), which used an effect obtained when a source follower transistor turns off, for limiting the amplitude of gate voltage, and a drop of load bearing ability can be restrained.

Figure 13:
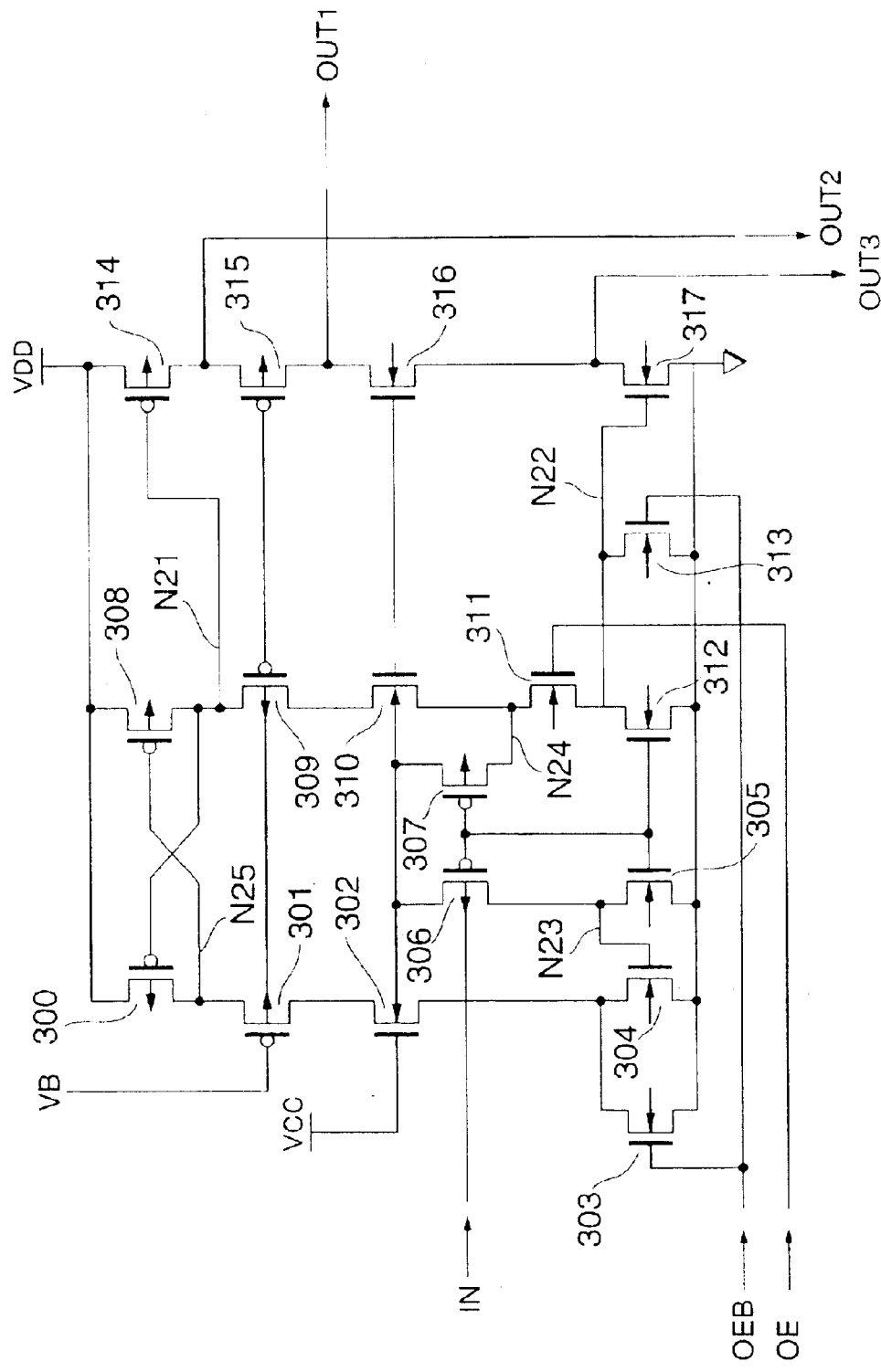
FIG. 13 is a circuit diagram showing a level transforming circuit of the first prior art.
Figure 14:
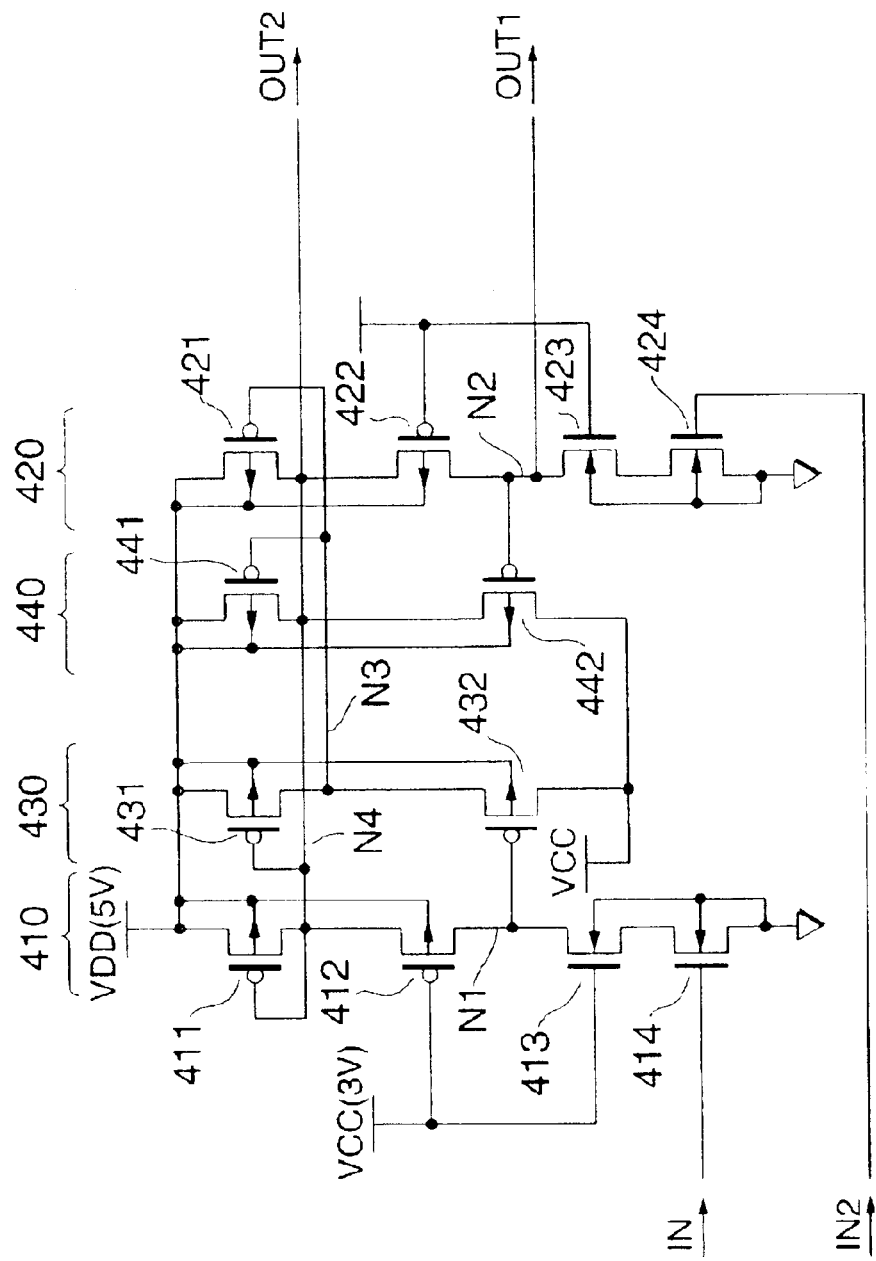
FIG. 14 is a circuit diagram showing a level transforming circuit of the second prior art.
Figure 15:
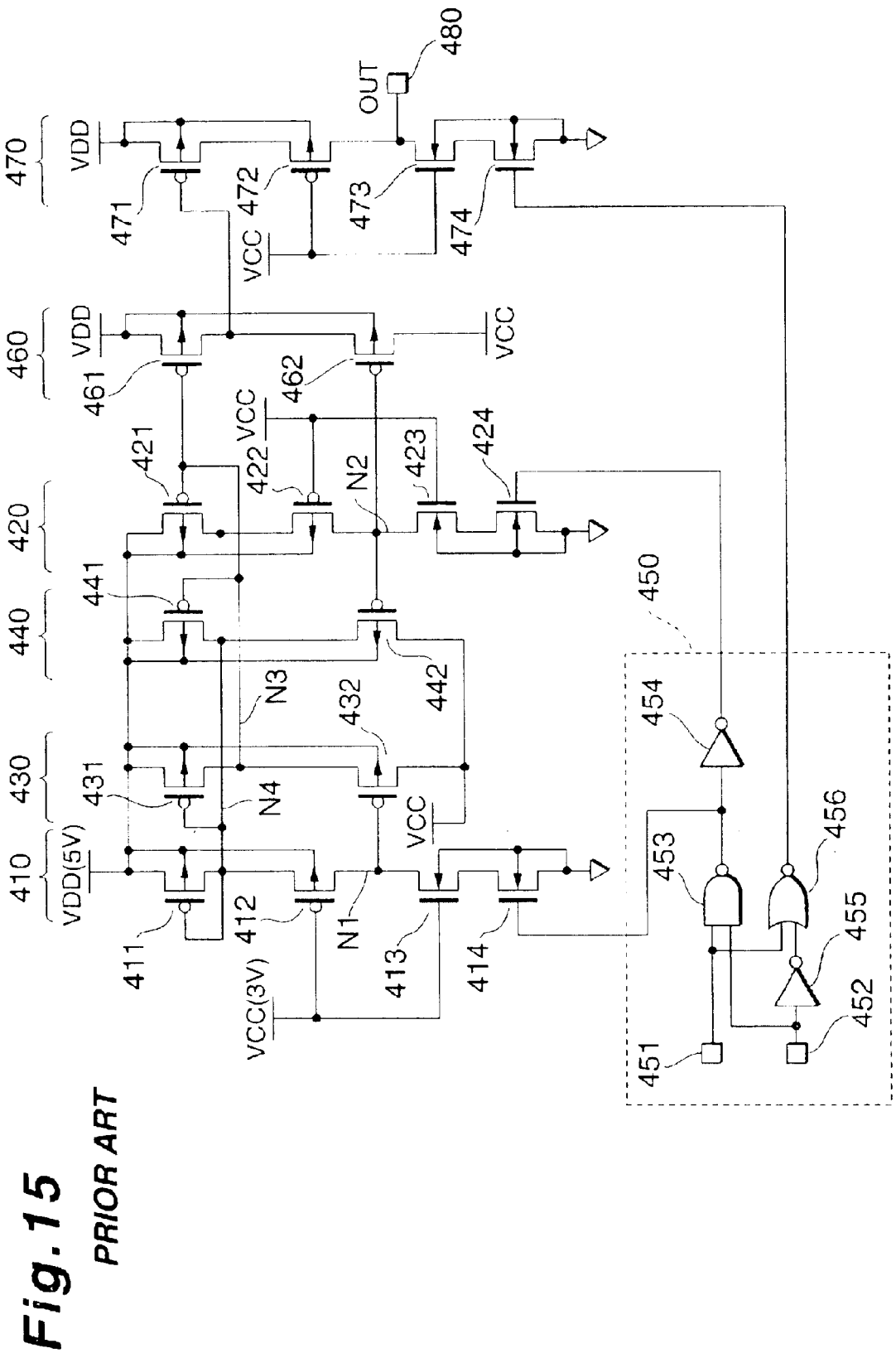
FIG. 15 is a circuit diagram showing an output circuit of the second prior art equipped with the level transforming circuit of FIG. 14.

Further, NMOS 22 of main buffer 20 and PMOS 41 of main buffer 40 are equipped to the structure of the output stage of the prior art (FIGS. 13 and 15). So, faster operation is possible. Besides, it is possible to decrease voltage between the source and drain of PMOS 71 and NMOS 72 of overvoltage protecting circuit 70, which is impressed when the output signal OUT changes.

Moreover, a pre-buffer circuit 30 is inserted at the stage before main buffer 20. So, off-on timing of main buffer circuit 40 is set corresponding to the off-on timing of main buffer 20. Therefore, electric current passing from the high voltage electricity source to the ground by way of overvoltage protecting circuit 70, decreases.

<Embodiment 2>

Embodiment 2 has almost the same configuration as Embodiment 1 except the following configuration. The resistance for turning on PMOS 21 of main buffer circuit 20 is set greater than the resistance for turning on PMOS 71 of overvoltage protecting circuit 70. Similarly, the resistance for turning on NMOS 42 of main buffer circuit 40 is set greater than the resistance for turning on NMOS 72 of overvoltage protecting circuit 70. The operation voltage limited by resisting voltage between the source and drain of PMOS transistor and NMOS transistor mentioned above is sufficiently higher than voltage (VCC+Vth), and it is sufficiently higher than voltage (VCC−VCC+Vth) and lower than voltage VDD. Here, a maximum of absolute value of the threshold of each MOS transistor is Vth.

<Operation of Embodiment 2>

When the data terminal 51 shifts its level from the ground level 0V to the low voltage level VCC, output node N11 of inverter 53 becomes the ground level 0V. The inverter 54 provides the output node N12 with the low voltage level VCC. The input IN and /IN of level transforming circuit 11a are connected with the node N12 and N11 respectively, and the high voltage level VDD is provided to the output OUT of level transforming circuit 11a. The output node N1 of pre-buffer circuit 30 becomes the low voltage level VCC, and the inverter 55, whose input is connected with the node N12, brings its output node N3 to the ground level 0V. The PMOS 21 of main buffer circuit 20 turns on, and NMOS 22 turns off.

The PMOS 41 of main buffer circuit 40 turns on, and NMOS 42 of it turns off. The PMOS 71 of overvoltage protecting circuit 70 turns on, as source electric potential of PMOS 71 increases, and NMOS 72 has yet turned on, while the electric potential of output signal OUT is sufficiently lower than the low voltage level VCC. So, the electric potential of output signal OUT rises up from the ground level 0V. In this occasion, turning on resistance of PMOS 21 of main buffer 20 is set higher than turning on resistance of PMOS 71 of overvoltage protecting circuit 70. So, gate source voltage of PMOS 71 is an extent slightly exceeding threshold voltage Vth. If current from PMOS 71 is set to turn on PMOS 21 of main buffer circuit 20 at timing when the output signal OUT slightly exceeds threshold voltage Vth, the source drain voltage of PMOS 71 of overvoltage protecting circuit 70 is restrained to an extent of the low voltage level VCC, even in a transient state. Thus, the output signal OUT becomes the high voltage level VDD.

On the other hand, when the data terminal 51 shifts from the low voltage level VCC to the ground level 0V, the output node N11 of inverter 53 becomes the low voltage level VCC. The inverter 54 provides the output node N12 with the ground level 0V. The input IN and /IN of level transforming circuit 11a are connected with the node N12 and N11 respectively, and the low voltage level VCC is provided to the output of level transforming circuit 11a. The output node N1 of pre-buffer circuit 30 becomes the high voltage level VDD, and the inverter 55, which input is connected with the node N12, brings its output node N3 to the low voltage level VCC. The PMOS 21 of main buffer circuit 20 turns off, and NMOS 22 of it turns on. The PMOS 41 of main buffer circuit 40 turns off, and NMOS 42 of it turns on, and NMOS 72 of it turns on, as source electric potential of PMOS 72 of the overvoltage protecting circuit 70 drops. The PMOS 71 of overvoltage protecting circuit 70 has yet turned on, while the electric potential of output signal OUT is sufficiently higher than the low voltage level VCC. Therefore, the output signal OUT becomes the ground level 0V, and electric potential of output signal OUT descends from the high voltage level VDD.

In this occasion, the turning on resistance of NMOS 42 of main buffer 40 is set higher than the turning on resistance of NMOS 72 of overvoltage protecting circuit 70. So, gate source voltage of NMOS 72 is an extent slightly exceeding threshold voltage Vth. If current from PMOS 71 is set to turn on NMOS 42 of main buffer circuit 40 at a timing when the output signal OUT falls down from the high voltage level VDD to a level slightly exceeding threshold voltage Vth, the source drain voltage of NMOS 72 of overvoltage protecting circuit 70 is restrained to an extent of (VDD–VCC) not exceeding the low voltage level VCC, even in a transient state. Thus, the output signal OUT becomes the ground level 0V.

As mentioned above, Embodiment 2 comprises PMOS 71 and NMOS 72 of overvoltage protecting circuit being impressed with an extent of the low voltage level VCC between source and drain, even in a transient state.

<Effect of Embodiment 2>

As described above, according to Embodiment 2, voltage exceeding the low voltage level VCC is never impressed between the source and drain of each transistor mentioned above, even in a transient state. Therefore, the output circuit can comprise only a MOS transistor whose source-drain strength is lower than the high voltage electricity source. Moreover, voltage exceeding the low voltage level is never impressed to the gate oxide film of each transistor mentioned above, even in a transient state. Therefore, a reliable output circuit can comprise only a MOS transistor whose strength of gate oxide film is lower than the high voltage electricity source level.

<Embodiment 3>

Figure 3:
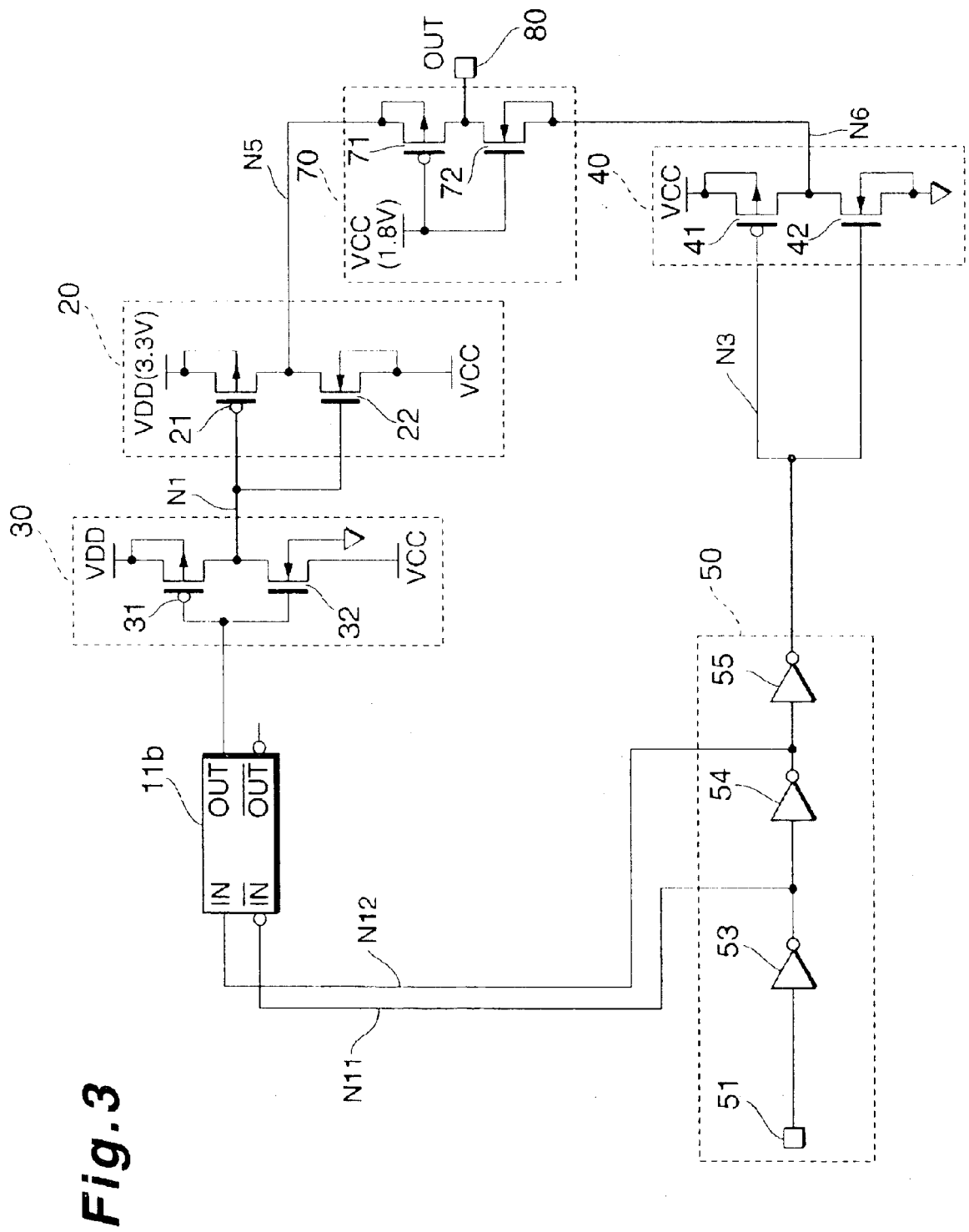
FIG. 3 is a circuit diagram showing an output circuit according to Embodiment 3.

FIG. 3 is a circuit diagram showing Embodiment 3. In FIG. 3, elements that are the same as Embodiment 1 are designated with the same symbol.

Embodiment 3 is different from Embodiment 1 or 2 in the following points. As for NMOS 32 of pre-buffer circuit 30 and NMOS 22 of main buffer circuit 20, their substrates are connected with the sources of each NMOS respectively instead of the ground. Moreover, as for PMOS 71 of overvoltage protecting circuit 70, its substrate is connected with its source (node N5) instead of the high voltage electricity source VDD. As for NMOS 72 of overvoltage protecting circuit 70, its substrate is connected with its source (node N6) instead of the ground. NMOS 32, 22 and 72 mentioned above are formed in a P well region, which is formed in a deep N well region formed on a p-type semiconductor substrate. Thus, these NMOS transistors are electrically separated from the semiconductor substrate.

Figure 4:
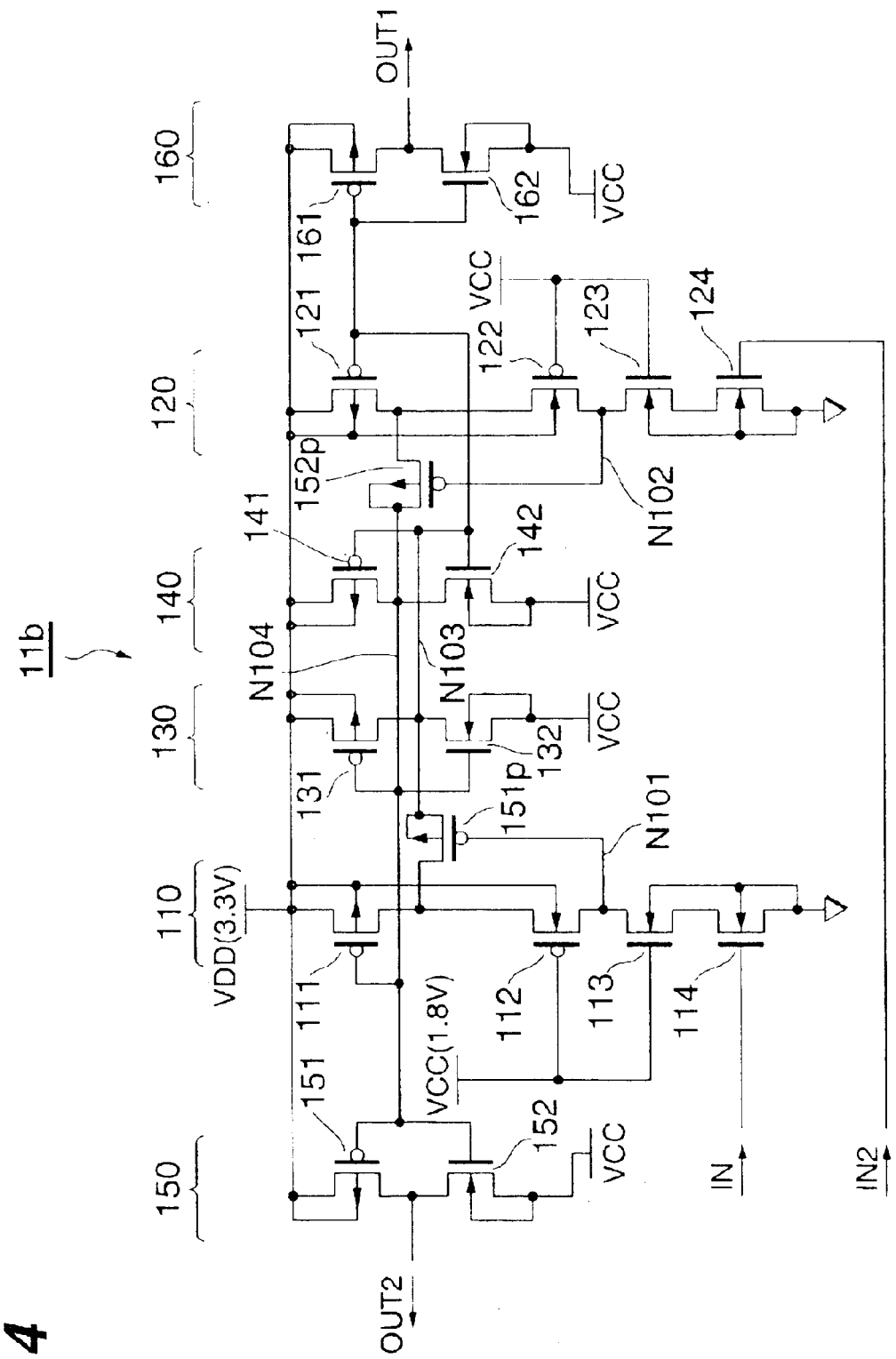
FIG. 4 is a circuit diagram showing a level transforming circuit equipped with the output circuit of FIG. 3.

Moreover, in Embodiment 3, the level transforming circuit 11a of FIG. 2 is replaced by a level transforming circuit 11b. FIG. 4 is a circuit diagram showing the level transforming circuit 11b. In FIG. 4, elements the same as the level transforming circuit 11a of FIG. 2 are designated with the same symbols.

The level transforming circuit 11b is different from the level transforming circuit 11a shown in FIG. 2 in the following points. As for NMOS 132 of intermediate circuit inverter 130, NMOS 142 of intermediate circuit inverter 140, NMOS 152 of inverter 150, and NMOS 162 of inverter 160, their substrates are connected with the sources of each NMOS respectively instead of the ground. As for PMOS 151p, its substrate is connected with the output node N103 instead of the high voltage electricity source VDD. And, as for NMOS 152p, its substrate is connected with the output node. N104 instead of the high voltage level VDD. NMOS 132, 142, 152 and 162 mentioned above are formed in a P well region, which is formed in a deep N well region formed on a p-type semiconductor substrate. Thus, these NMOS transistors are electrically separated from the semiconductor substrate.

<Operation of Embodiment 3>

The operation of this circuit is same as Embodiment 1 and 2 mentioned above. In Embodiment 1 mentioned above, it is described that the voltage impressed with the gate oxide film is an extent of the low voltage level VCC even when the gate-substrate voltage is the high voltage level VCC.

<Effect of Embodiment 3>

In Embodiment 3, NMOS 32, 22 and 72 are formed in P well region electrically separated from the semiconductor substrate, and PMOS 71 is separated from N well of other PMOS. Besides, substrates of NMOS 32, 22, 72 and PMOS 71 are connected with their own sources respectively. Therefore, an effect is obtained of further relieving load to gate oxide film of NMOS 32, 22, 72 and PMOS 71. Moreover, inverse bias voltage impressed with the pn junction is relieved, which is formed by the drain and substrate of NMOS 32, 22, 72 and PMOS 71. Moreover, faster operation of the circuit is expected, because the influence of substrate bias on the operation of the circuit does not exist about NMOS 32 and 22.

Element isolation technique such as triple well structure applied to Embodiment 3, has been adopted for LSI made by a fine process, for the purpose of reducing substrate noise or reducing leak current, and the cost of production increases by several percent. But, this technique is necessarily adopted from now on, as fineness of elements proceeds. That is, this technique is not adopted only for making the structure of Embodiment 3. Thus, what makes the process of production complicated, is not Embodiment 3.

<Embodiment 4>

Figure 5:
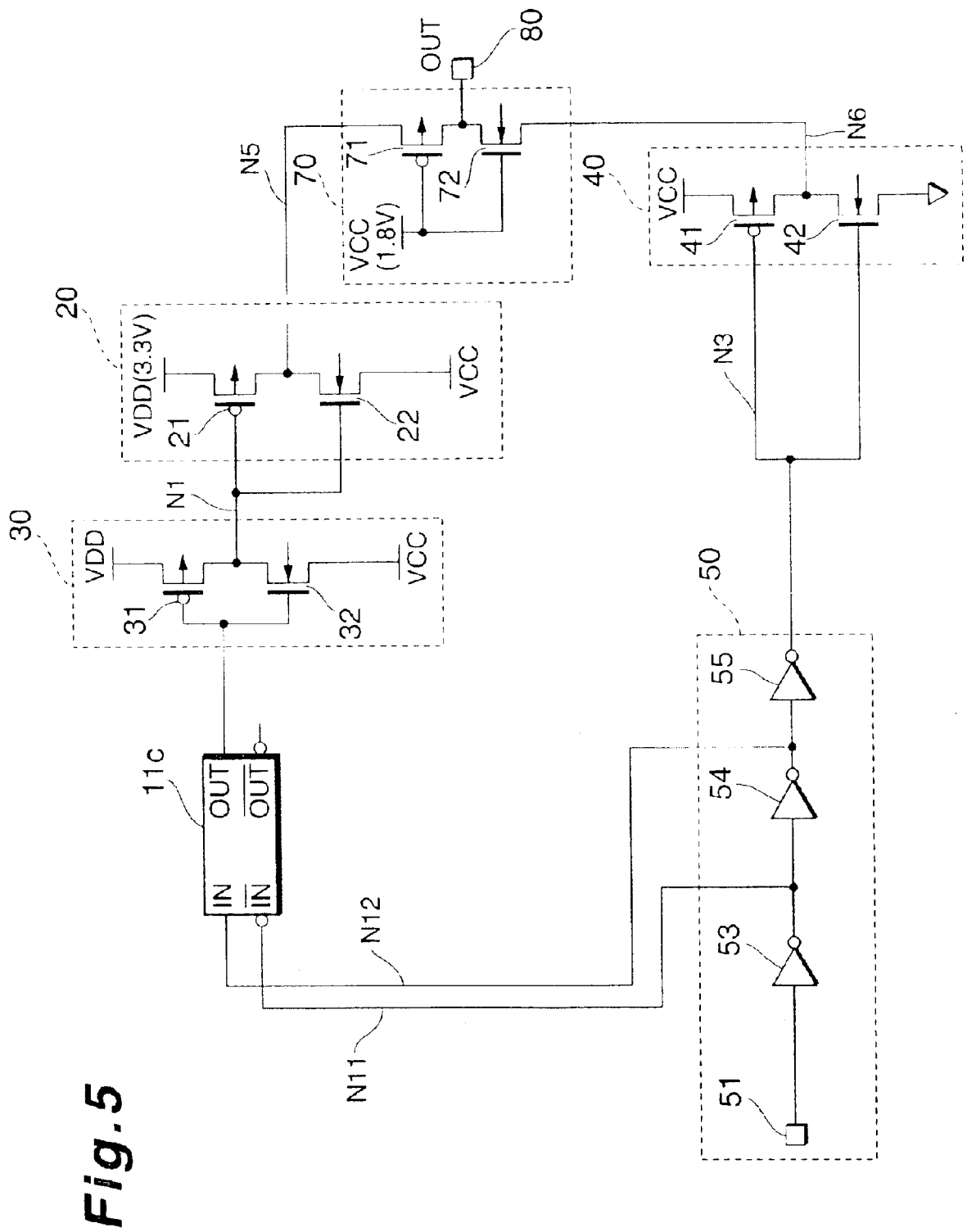
FIG. 5 is a circuit diagram showing an output circuit according to Embodiment 4.

FIG. 5 is a circuit diagram showing Embodiment 4. Embodiment 4 is what comprises each MOS transistor of Embodiment 1, 2 or 3 formed in a silicon region isolated completely by an oxide film. That is, each MOS transistor comprises a transistor of SOI (Silicon On Insulator) structure.

The well region (substrate) of bulk CMOS in FIG. 1 is called a body region in SOI structure. As for SOI of complete depletion type, the body is usually set in floating state, and transistor having three terminals is obtained. Moreover, as for SOI of partial depletion type, there is an occasion when the body is set in floating state. There is the other occasion when the body is connected with the source or with the electricity source level the same as bulk CMOS. The configuration of Embodiment 4 is the same as the configuration of Embodiment 1, 3 shown in FIG. 1, 3, in the occasion when the body is connected with source or with electricity source level as same as bulk CMOS. FIG. 5 shows the occasion when body is set in floating state.

Figure 6:
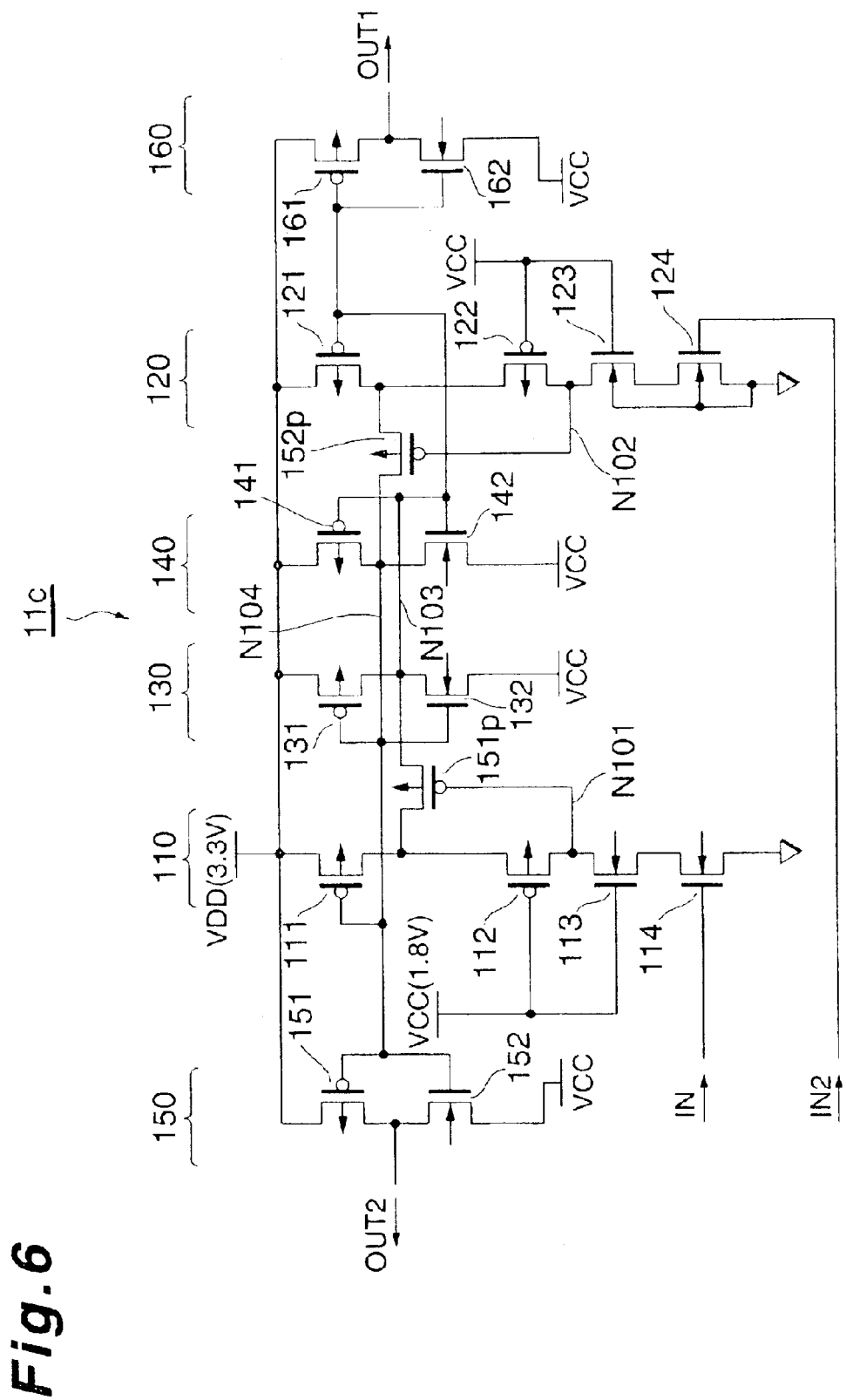
FIG. 6 is a circuit diagram showing a level transforming circuit equipped with the output circuit of FIG. 5.

Moreover, in Embodiment 4, the level transforming circuit 11a of FIG. 2 is replaced by a level transforming circuit 11c. FIG. 6 is a circuit diagram showing the level transforming circuit 11c. In FIG. 6, elements the same as the level transforming circuit 11a of FIG. 2 are designated with the same symbols.

The level transforming circuit 11a shown in FIG. 6 comprises each MOS transistor in the level transforming circuit shown in FIG. 2, formed in silicon region isolated completely by an oxide film. That is, each MOS transistor comprises a transistor of SOI (Silicon On Insulator) structure. The well region substrate of bulk CMOS in FIG. 2 is called a body region in SOI structure. As for SOI of a complete depletion type, the body is usually set in a floating state, and transistor having three terminals is obtained. Moreover, as for SOI a of partial depletion type, there is an occasion when the body is set in a floating state, and there is the other occasion when body is connected with source or with the electricity source level the same as bulk CMOS. The configuration of level transforming circuit 11c is the same as the configuration of level transforming circuit 11a, 11b shown in FIG. 2, 4, in the occasion when the body is connected with the source or with electricity source level as the same as bulk CMOS. FIG. 6 shows the occasion when the body is set in a floating state.

<Operation of Embodiment 4>

The operation of the circuit of Embodiment 4 is the same as that of Embodiment 1 or 2 mentioned above.

In the description of Embodiment 1 mentioned above, the inverse bias strength of the pn junction between the diffusing region and the substrate, comprising each PMOS transistor and each NMOS transistor of bulk CMOS, is set higher than high voltage level VDD, was described. On the wafer of SOI structure, a berried oxide film is formed, whose thickness is an extent of 100 nm to 500 nm in the silicon layer beneath the surface of wafer, and the region where each transistor is formed is isolated from each other by an oxide film of similar size. Therefore, the strength of isolating oxide film, which corresponds to the inverse bias strength of the pn junction between the diffusing region and the substrate forming each PMOS transistor and each NMOS transistor of bulk CMOS, is set as strong as 10 V or stronger.

<Effect of Embodiment 4>

In Embodiment 4, a MOS transistor of SOI structure is adopted. Therefore, the body (substrate) is able to be used in a floating state. Then, the manufacturer does not need to care for the voltage between the gate and body (substrate) of each MOS transistor, and the strength between the drain and substrate. Moreover, as mentioned above, the strength between body and substrate is sufficiently strong compared with the high voltage level VDD. Therefore, in the latest process of manufacturing a fine structure of semiconductor, a semiconductor integrated circuit with higher reliability is manufactured.

Moreover, an element region is completely isolated by an oxide film. Therefore, a a parasitic capacity of the source and drain of each MOS transistor decreases, and faster operation of the circuit can be obtained. Further, element isolation of SOI structure adopted in Embodiment 4 is beneficial to decreasing noise in the substrate or decreasing leak current in the junction.

<Embodiment 5>

FIG. 5 is a circuit diagram showing Embodiment 5, which comprises a three states output circuit.

Figure 7:
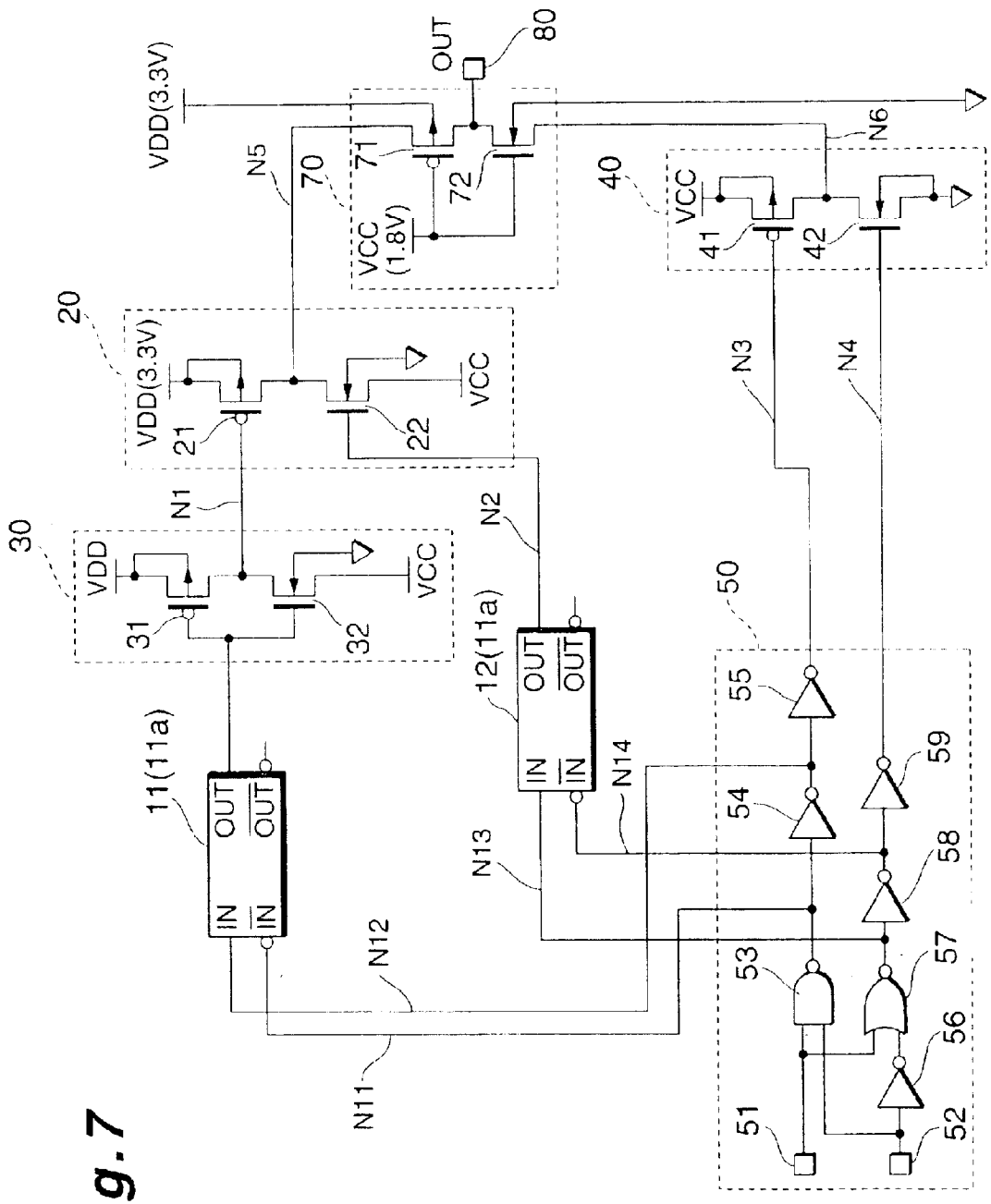
FIG. 7 is a circuit diagram showing an output circuit according to Embodiments 5 and 6.

This output circuit comprises, as shown in FIG. 7, a logic circuit 50 (an example of the first control circuit section of present invention), a first level transforming circuit 11 (an example of the first level transforming circuit of present invention), a second level transforming circuit 12 (an example of the second level transforming circuit of present invention), a pre-buffer circuit 30 (an example of the pre-buffer circuit of present invention), a main buffer circuit 20 (an example of the first buffer circuit of present invention), a main buffer circuit 40 (an example of the second buffer circuit of present invention), and an overvoltage protecting circuit 70 (an example of the overvoltage protecting circuit of present invention). Hereafter, each element is described in this order.

(Logic Circuit 50),

The logic circuit 50 of the low voltage electricity source system has a data terminal 51 and an enable terminal 52, and it comprises a NAND gate 53, a NOR gate 57, and inverters 54, 55, 56, 58, 59. NAND gate 53 has input thereto a signal from data terminal 51 and signal from enable terminal 52, and its output signal is provided to the input of inverter 54 and to the input /IN of level transforming circuit 11. Then, the output signal of inverter 54 is provided to the input of inverter 55 and to the input IN of level transforming circuit 11. NOR gate 57 has input thereto a signal from data terminal 51 and an inverse signal from enable terminal 52, and its output signal is provided to the input of inverter 58 and to the input IN of level transforming circuit 12. Then, the output signal of inverter 58 is provided to the input of inverter 59 and to the input /IN of level transforming circuit 12. Moreover, the output of logic circuit 50 is provided to the main buffer circuit 40.

(Level Transforming Circuit 11)

The level transforming circuit 11 has input thereto the output of logic circuit 50, and it is transformed into a signal of amplitude between the high voltage VDD and the low voltage VCC, so as to output. Further, the output of the level transforming circuit 11 is connected with a pre-buffer circuit 30. The pre-buffer circuit 30 is connected with a main buffer circuit 20.

(Level Transforming Circuit 12)

The level transforming circuit 12 has input thereto the output of logic circuit 50, and it is transformed into a signal of amplitude between the high voltage VDD and the low voltage VCC, so as to output. Further, with the output of the level transforming circuit 12, is connected is with main buffer circuit 20.

(Pre-Buffer Circuit 30)

The pre-buffer circuit 30,comprises PMOS 31 and NMOS 32, and it provides gates of PMOS 21 of main buffer circuit 20 with a signal of an amplitude between the high voltage VDD and the low voltage VCC.

(Main Buffer Circuit 20)

The main buffer circuit 20 comprises PMOS 21 and NMOS 22, and it provides the overvoltage protecting circuit 70 with an output signal of an amplitude between the high voltage VDD and the low voltage VCC.

(Main Buffer Circuit 40)

The main buffer circuit 40 comprises PMOS 41 and NMOS 42. The gate of NMOS 42 of the main buffer circuit 40 is provided with output signal of inverter 59. The gate of PMOS 41 of the main buffer circuit 40 is provided with output signal of inverter 55, and the main buffer circuit 40 provides one of the terminals of overvoltage protecting circuit 70 with an output signal of an amplitude between the ground level 0V and the low voltage VCC.

(Overvoltage Protecting Circuit 70)

The output signal OUT is output from overvoltage protecting circuit 70 to the outside of the integrated circuit by way of an output pad 80, and it comprises PMOS 71 and NMOS 72, whose gates are impressed with the low voltage level in common, and whose drains are connected with each other.

In the structure mentioned above, the pre-buffer circuit 30 comprises an inverter, and the substrate (n-type well region) of PMOS 31 is connected with the high voltage electricity source VDD. Besides, the substrate of NMOS 32 is connected with the ground. Similarly, main buffer circuit 20 comprises an inverter. And, the substrate (n-type well region) of PMOS 21 is connected with the high voltage electricity source VDD. Besides, the substrate of NMOS 22 is connected with the ground. Moreover, the main buffer circuit 40 comprises an inverter. And, the substrate (n-type well region) of PMOS 41 is connected with the low voltage electricity source VCC. Besides, the substrate of NMOS 42 is connected with the ground, and the substrate (n-type well region) of PMOS 71 of overvoltage protecting circuit 70 is connected with the high voltage electricity source VDD. Besides, the substrate of NMOS 72 is connected with the ground.

The structure of level transforming circuit 11, 12 of Embodiment 5 is same as that of level transforming circuit 11a shown in FIG. 2.

The operating voltage of each PMOS transistor and NMOS transistor mentioned above is limited by the dielectric strength of their gate oxide film within the scope of more than VCC and more than VDD−VCC and less than VDD. In the description mentioned below, it is provided that a relation of VDD>VCC>=VDD−VCC maintained. Moreover, the inverse bias strength of the pn junction between the diffusing region and substrate of each PMOS transistor and NMOS transistor is set higher than the high voltage VDD.

<Operation of Embodiment 5>

When ground level (0V) is inputted to the enable terminal 52, the output OUT of level transforming circuit 11 becomes the low voltage level VCC, and the output node N1 of pre-buffer circuit 30 becomes the high voltage level VDD. Then, PMOS 21 of main buffer 20 turns off. Moreover, the output OUT of level transforming circuit 12 becomes the low voltage level VCC. Then, NMOS 22 of main buffer 20 turns off. On the other hand, PMOS 41 of main buffer circuit 40 turns off, because the gate of PMOS 41 becomes the low voltage level VCC, and NMOS 42 of main buffer circuit 40 turns off, because the gate of NMOS 42 becomes the low voltage level VCC. Then, output signal OUT is in a state of high impedance.

In this occasion, if the output signal OUT is impressed with the high voltage level VDD, PMOS 71 of overvoltage protecting circuit 70 turns on. Then, node N5 becomes the high voltage level VDD, and node N6 becomes VCC−Vtn, as Vtn is threshold voltage of NMOS 72. Moreover, if the output signal OUT is impressed with the ground level 0V, NMOS 72 of overvoltage protecting circuit 70 turns on. Then, node N6 becomes the ground level 0V, and node N5 becomes VCC+Vtp, as Vtp is threshold voltage of PMOS 71.

Moreover, when low voltage level VCC is impressed to the enable terminal 52 and low voltage level VCC is impressed to the data terminal 51, output node N11 of NAND gate 53 becomes the ground level 0V. The inverter 54 inputted with this signal provides the output node N12 with the low voltage level VCC. The input IN and /IN of level transforming circuit 11 are connected with the node N12 and N11 respectively, and the high voltage level VDD is provided to the output of level transforming circuit 11. The output node N1 of pre-buffer circuit 30 becomes the low voltage level VCC. On the other side, output node N13 of NOR gate 57 becomes the ground level 0V. The inverter 58 inputted with this signal, provides the output node N14 with the low voltage level VCC. Then, PMOS 21 and NMOS 22 of main buffer circuit 20 turn on respectively, and the inverter 55, whose input is connected with the node N12, brings its output node N3 to the ground level 0V. Besides, the inverter 59, whose input is connected with the node N14, brings its output node N4 to the ground level 0V. Then, PMOS 41 of main buffer circuit 40 turns on, and NMOS 42 turns off. The PMOS 71 of overvoltage protecting circuit 70 turns on, and NMOS 72 turns off. Therefore, the output signal OUT becomes the high voltage level VDD.

On the other hand, when the enable terminal 52 is impressed with the low voltage level VCC and the data terminal 51 is impressed with the ground level 0V, the output node N11 of NAND gate 53 becomes the low voltage level VCC. The inverter 54 inputted with this signal provides the output node N12 with the ground level 0V. The input IN and /IN of level transforming circuit 11 are connected with the node N12 and N11 respectively. The low voltage level VCC is provided to the output of level transforming circuit 11. The output node N1 of pre-buffer circuit 30 becomes the high voltage level VDD. The output node N13 of NOR gate 57 becomes the low voltage level VCC, and the inverter 58, inputted with this signal provides the output node N14 with the ground level 0V. The PMOS 21 of main buffer circuit 20 turns off, and NMOS 22 turns on. The inverter 55, which input is connected with node 12, brings its output node N3 to the low voltage level VCC, and the inverter 59, whose input is connected with node 14, brings its output node N4 to the low voltage level VCC. Then, PMOS 41 of main buffer circuit 40 turns off, and NMOS 42 turns on. The NMOS 72 of overvoltage protecting circuit 70 turns on, and PMOS 71 turns off. Therefore, the output signal OUT becomes the ground level 0V.

Therefore, the output circuit of FIG. 7 functions as an output circuit, which transforms a signal of amplitude between the ground level 0V and the low voltage level VCC into a signal of amplitude between the ground level 0V and the high voltage level VDD. Moreover, it outputs a high impedance state. Thus, this circuit functions as a three state output circuit.

PMOS 41 of main buffer circuit 40 accelerates the rising of output signal OUT by way of NMOS 72 of the overvoltage protecting circuit 70, when the output signal OUT shifts from the ground level 0V to the high voltage level VDD. Moreover, PMOS 41 of main buffer circuit 40 accelerates the falling of output signal OUT by way of PMOS 71 of the overvoltage protecting circuit 70, when the output signal OUT shifts from the high voltage level VDD to the ground level 0V.

In the operation mentioned above, voltage higher than the low voltage level VCC is never impressed between the gate and the source or drain of each MOS transistor. Moreover, between the gate and the substrate, voltage higher than the low voltage level VCC is never impressed, except NMOS 22, 32. When a channel is formed as the MOS transistor is on, the channel is in the same electric potential as the source. So, the voltage between source and substrate is not impressed to the gate oxide film. Only the voltage between the gate and source is impressed to the gate oxide film.

On the other hand, when a channel is not formed as the MOS transistor is off, total voltage Vgs+Vsb consisting of gate source voltage Vgs and source substrate voltage Vsb is divided between gate oxide film and depletion layer beneath the gate. The depletion layer extends as Vsb increases, and the voltage impressed to the gate oxide film does not increase so much. With the reason mentioned above, even if Vsb is impressed, the maximum voltage impressed to the gate oxide film is not different from the conventional art. So, reliability of the gate oxide film is never deteriorated.

<Effect of Embodiment 5>

As mentioned above, according to Embodiment 5, obtained is a three state output circuit, which has the same effect as Embodiment 1 mentioned above. Moreover, the main buffer circuit 20 and 40 are driven by different signals respectively. Therefore, by adequately adjusting timings of these signals respectively, current passing through the circuit can be decreased. So, it is possible to obtain an output circuit with small electricity consumption.

Further, in the occasion when output is in high impedance state: if the output is impressed with the electric potential of high voltage level VDD or ground level 0V, voltage clamped by the overvoltage protecting circuit 70 appears at the node N6. Therefore, it is possible to make a combined circuit of input and output, by attaching an input circuit, which operates with low voltage electricity source, to the node N6.

<Embodiment 6>

Embodiment 6 has almost the same configuration as Embodiment 5 except for the following configuration. The resistance for turning on PMOS 21 of main buffer circuit 20 is set greater than the resistance for turning on PMOS 71 of overvoltage protecting circuit 70. Similarly, the resistance for turning on NMOS 42 of main buffer circuit 40 is set greater than the resistance for turning on NMOS 72 of overvoltage protecting circuit 70. The operation voltage limited by resisting voltage between source and drain of PMOS transistor and NMOS transistor mentioned above is sufficiently higher than voltage (VCC+Vth), and it is sufficiently higher than voltage (VCC−VCC+Vth) and lower than voltage VDD. Here, a maximum of absolute value of the threshold of each MOS transistor is Vth.

<Operation of Embodiment 6>

When ground level (0V) is inputted to the enable terminal 52, the output OUT of level transforming circuit 11 becomes the low voltage level VCC, and the output node N1 of pre-buffer circuit 30 becomes the high voltage level VDD. Then, PMOS 21 of main buffer 20 turns off. Moreover, the output OUT of level transforming circuit 12 becomes the low voltage level VCC. Then, NMOS 22 of main buffer 20 turns off. On the other hand, PMOS 41 of main buffer circuit 40 turns off because the gate of PMOS 41 becomes the low voltage level VCC, and NMOS 42 of main buffer circuit 40 turns off, because the gate of NMOS 42 becomes the low voltage level VCC. Then, output signal OUT gets in a state of high impedance.

In this occasion, if the output signal OUT is impressed with the high voltage level VDD, PMOS 71 of overvoltage protecting circuit 70 turns on. Then, node N5 becomes the high voltage level VDD, and node N6 becomes VCC−Vtn, as Vtn is threshold voltage of NMOS 72. Moreover, if the output signal OUT is impressed with the ground level 0V, NMOS 72 of overvoltage protecting circuit 70 turns on. Then, node N6 becomes the ground level 0V, and node N5 becomes VCC+Vtp, as Vtp is threshold voltage of PMOS 71.

Moreover, when low voltage level VCC is impressed to the enable terminal 52 and low voltage level VCC is impressed to the data terminal 51; output node N11 of NAND gate 53 becomes the ground level 0V. The inverter 54 inputted with this signal, provides the output node N12 with the low voltage level VCC. The input IN and /IN of level transforming circuit 11 are connected with the node N12 and N11 respectively, and the high voltage level VDD is provided to the output of level transforming circuit 11. The output node N1 of pre-buffer circuit 30 becomes the low voltage level VCC. On the other side, output node N13 of NOR gate 57 becomes the ground level 0V. The inverter 58 inputted with this signal provides the output node N14 with the low voltage level VCC. Then, PMOS 21 and NMOS 22 of main buffer circuit 20 turn on respectively, and the inverter 55, whose input is connected with the node N12 brings its output node N3 to the ground level 0V. Besides, the inverter 59, whose input is connected with the node N14, brings its output node N4 to the ground level 0V. Then, PMOS 41 of main buffer circuit 40 turns on, and NMOS 42 turns off. The PMOS 71 of overvoltage protecting circuit 70 turns on, as source electric potential of PMOS 71 increases. And, NMOS 72 of it has yet turned on, while the electric potential of output signal OUT is sufficiently lower than the low voltage level VCC. So, the electric potential of output signal OUT rises up from the ground level 0V.

In this occasion, turning on resistance of PMOS 21 of main buffer 20 is set higher than turning on resistance of PMOS 71 of overvoltage protecting circuit 70. So, gate source voltage of PMOS 71 is an extent slightly exceeding threshold voltage Vth. If current from PMOS 71 is set to turn on PMOS 21 of main buffer circuit 20 at timing when the output signal OUT slightly exceeds threshold voltage Vth, the source drain voltage of PMOS 71 of overvoltage protecting circuit 70 is restrained to an extent of the low voltage level VCC, even in a transient state. Thus, the output signal OUT becomes the high voltage level VDD.

On the other hand, when the enable terminal 52 is impressed with the low voltage level VCC and the data terminal 51 is impressed with the ground level 0V, the output node N11 of NAND gate 53 becomes the low voltage level VCC. The inverter 54 inputted with this signal provides the output node N12 with the ground level 0V. The input IN and /IN of level transforming circuit 11 are connected with the node N12 and N11 respectively. The low voltage level VCC is provided to the output of level transforming circuit 11. The output node N1 of pre-buffer circuit 30 becomes the high voltage level VDD. The output node N13 of NOR gate 57 becomes the low voltage level VCC, and the inverter 58, inputted with this signal, provides the output node N14 with the ground level 0V. The PMOS 21 of main buffer circuit 20 turns off, and NMOS 22 of it turns on. The inverter 55, which input is connected with node 12, brings its output node N3 to the low voltage level VCC, and the inverter 59, whose input is connected with node 14, brings its output node N4 to the low voltage level VCC. Then, PMOS 41 of main buffer circuit 40 turns off, and NMOS 42 turns on. And, NMOS 72 of it turns on, as source electric potential of PMOS 72 of the overvoltage protecting circuit 70 drops. The PMOS 71 of overvoltage protecting circuit 70 has yet turned on, while the electric potential of output signal OUT is sufficiently higher than the low voltage level VCC. Therefore, the output signal OUT becomes the ground level 0V, and electric potential of output signal OUT descends from the high voltage level VDD.

In this occasion, turning on resistance of NMOS 42 of main buffer 40 is set higher than turning on resistance of NMOS 72 of overvoltage protecting circuit 70. So, gate source voltage of NMOS 72 is an extent slightly exceeding threshold voltage Vth. If current from PMOS 71 is set to turn on NMOS 42 of main buffer circuit 40 at timing when the output signal OUT falls down from the high voltage level VDD to a level slightly exceeding threshold voltage Vth, the source drain voltage of NMOS 72 of overvoltage protecting circuit 70 is restrained to an extent of (VDD−VCC) not exceeding the low voltage level VCC, even in a transient state. Thus, the output signal OUT becomes the ground level 0V.

As mentioned above, Embodiment 6 comprises PMOS 71 and NMOS 72 of overvoltage protecting circuit being impressed with an extent of the low voltage level VCC between the source and drain, even in a transient state.

<Effect of Embodiment 6>

As mentioned above, according to Embodiment 6, obtained is a three state output circuit, which has same effect as Embodiment 2 mentioned above. Moreover, the main buffer circuit 20 and 40 are driven by different signals respectively. Therefore, by adequately adjusting timings of these signals respectively, current passing through the circuit can be decreased. So, it is possible to obtain an output circuit with small electricity consumption.

<Embodiment 7>

Figure 8:
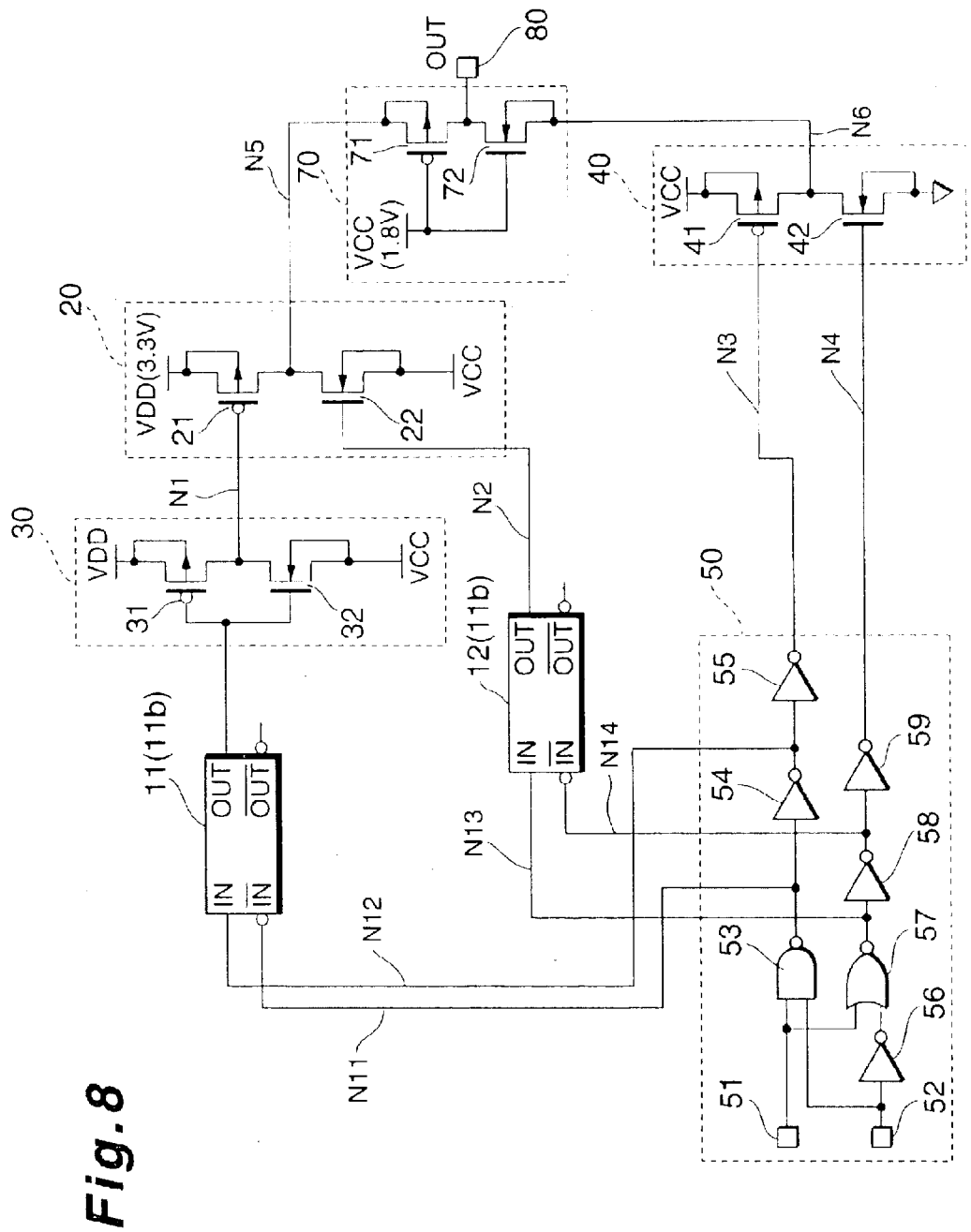
FIG. 8 is a circuit diagram showing an output circuit according to Embodiment 7.

FIG. 8 is a circuit diagram showing Embodiment 7. In FIG. 8, elements that are the same as Embodiment 5 are designated with the same symbol.

Embodiment 7 is different from Embodiment 5 or 6 in the following points. As for NMOS 32 of pre-buffer circuit 30 and NMOS 22 of main buffer circuit 20, their substrates are connected with the sources of each NMOS respectively instead of the ground. Moreover, as for PMOS 71 of overvoltage protecting circuit 70, its substrate is connected with its source (node N5) instead of the high voltage electricity source VDD, and as for NMOS 72 of overvoltage protecting circuit 70, its substrate is connected with its source (node N6) instead of the ground. NMOS 32, 22 and 72 mentioned above are formed in a P well region, which is formed in a deep N well region formed on a p-type semiconductor substrate. Thus, these NMOS transistors are electrically separated from the semiconductor substrate.

The structure of level transforming circuit 11, 12 of Embodiment 7 is the same as that of level transforming circuit 11b shown in FIG. 4.

<Operation of Embodiment 7>

The operation of this circuit is same as Embodiment 5 and 6 mentioned above. In Embodiment 1 or 5 mentioned above, it is described that the voltage impressed with the gate oxide film is an extent of the low voltage level VCC even when the gate-substrate voltage is the high voltage level VCC.

<Effect of Embodiment 7>

As mentioned above, according to Embodiment 7, obtained is a three state output circuit, which has the same effect as Embodiment 3 mentioned above. Moreover, the main buffer circuit 20 and 40 are driven by different signals respectively. Therefore, by adequately adjusting timings of these signals respectively, current passing through the circuit can be decreased. So, it is possible to obtain an output circuit with small electricity consumption.

<Embodiment 8>

Figure 9:
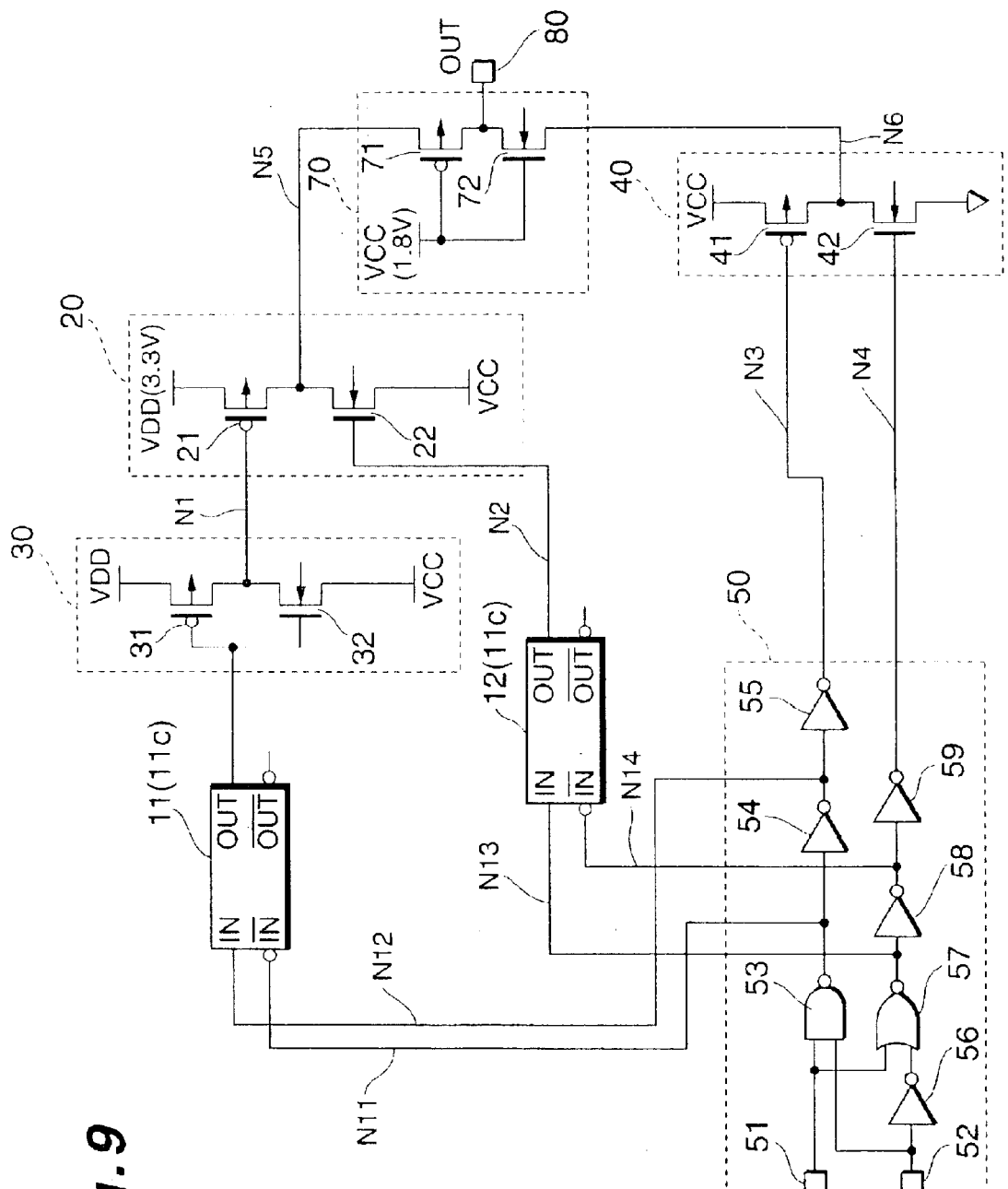
FIG. 9 is a circuit diagram showing an output circuit according to Embodiment 8.

FIG. 9 is a circuit diagram showing Embodiment 8. Embodiment 8 is what comprises each MOS transistor of Embodiment 5, 6 or 7 formed in silicon region isolated completely by an oxide film. That is, each MOS transistor comprises a transistor of SOI (Silicon On Insulator) structure.

The structure of level transforming circuit 11, 12 of Embodiment 8 is the same as that of level transforming circuit 11c shown in FIG. 6.

The well region (substrate) of bulk CMOS in FIG. 1 or 5 is called a body region in SOI structure. As for SOI of complete depletion type, the body is usually set in a floating state, and transistor having three terminals is obtained. Moreover, as for SOI of a partial depletion type, there is an occasion when the body is set in a floating state, and there is the other occasion when body is connected with source or with the electricity source level as same as bulk CMOS. The configuration of Embodiment 8 is the same as the configuration of Embodiment 7 shown in FIG. 8, in the occasion when the body is connected with the source or with electricity source level the same as bulk CMOS. FIG. 9 shows the occasion when the body is set in a floating state.

<Operation of Embodiment 8>

The operation of the circuit of Embodiment 8 is the same as that of Embodiment 5 or 6 mentioned above.

In the description of Embodiment 1 or 5 mentioned above, the inverse bias strength of the pn junction between the diffusing region and substrate, comprising each PMOS transistor and each NMOS transistor of bulk CMOS, is set higher than high voltage level VDD, was described. On the wafer of SOI structure, formed is a berried oxide film is formed, whose thickness is an extent of 100 nm to 500 nm in the silicon layer beneath the surface of wafer, and the region where each transistor is formed is isolated each other by oxide film of similar size. Therefore, the strength of an isolating oxide film, which corresponds to the inverse bias strength of the pn junction between the diffusing region and substrate forming each PMOS transistor and each NMOS transistor of bulk CMOS, is set as strong as 10V or stronger.

<Effect of Embodiment 8>

As mentioned above, according to Embodiment 8, obtained is a three state output circuit, which has the same effect as Embodiment 4 mentioned above. Moreover, the main buffer circuit 20 and 40 are driven by different signals respectively. Therefore, by adequately adjusting timings of these signals respectively, current passing through the circuit can be decreased. So, it is possible to obtain an output circuit with small electricity consumption.

<Embodiment 9>

Figure 10:
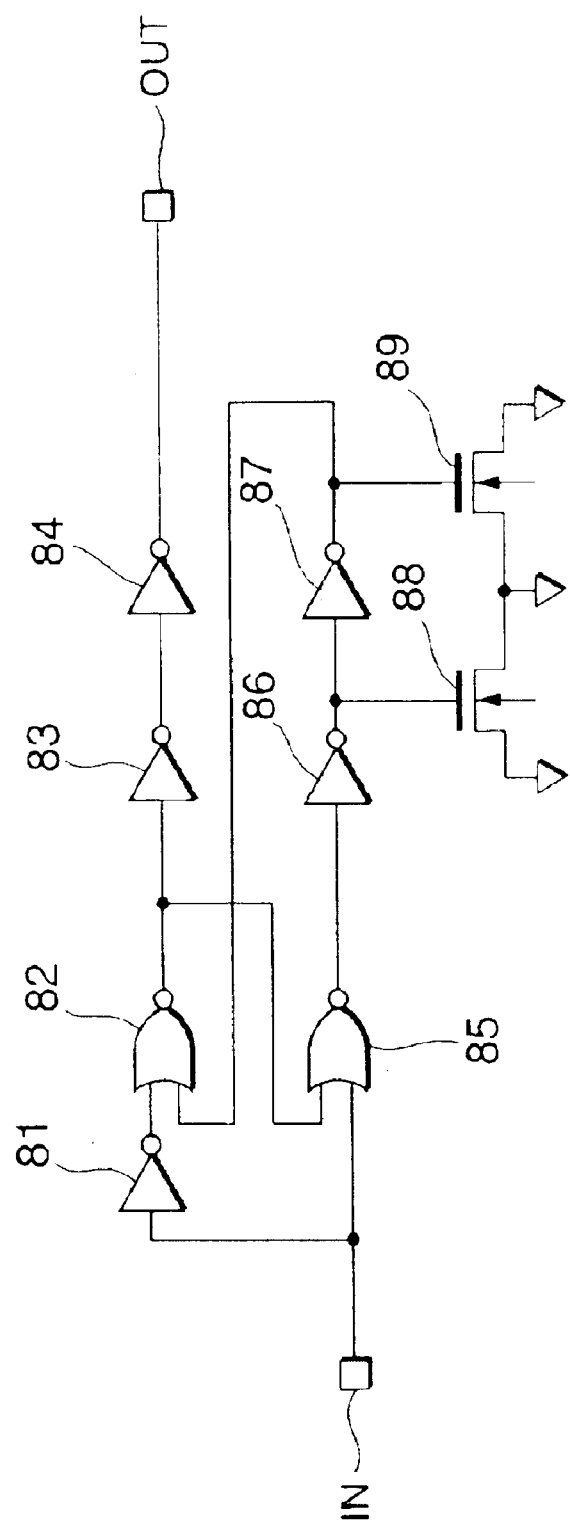
FIG. 10 is a circuit diagram showing the structure of delay adjusting circuit DLY1.
Figure 11:
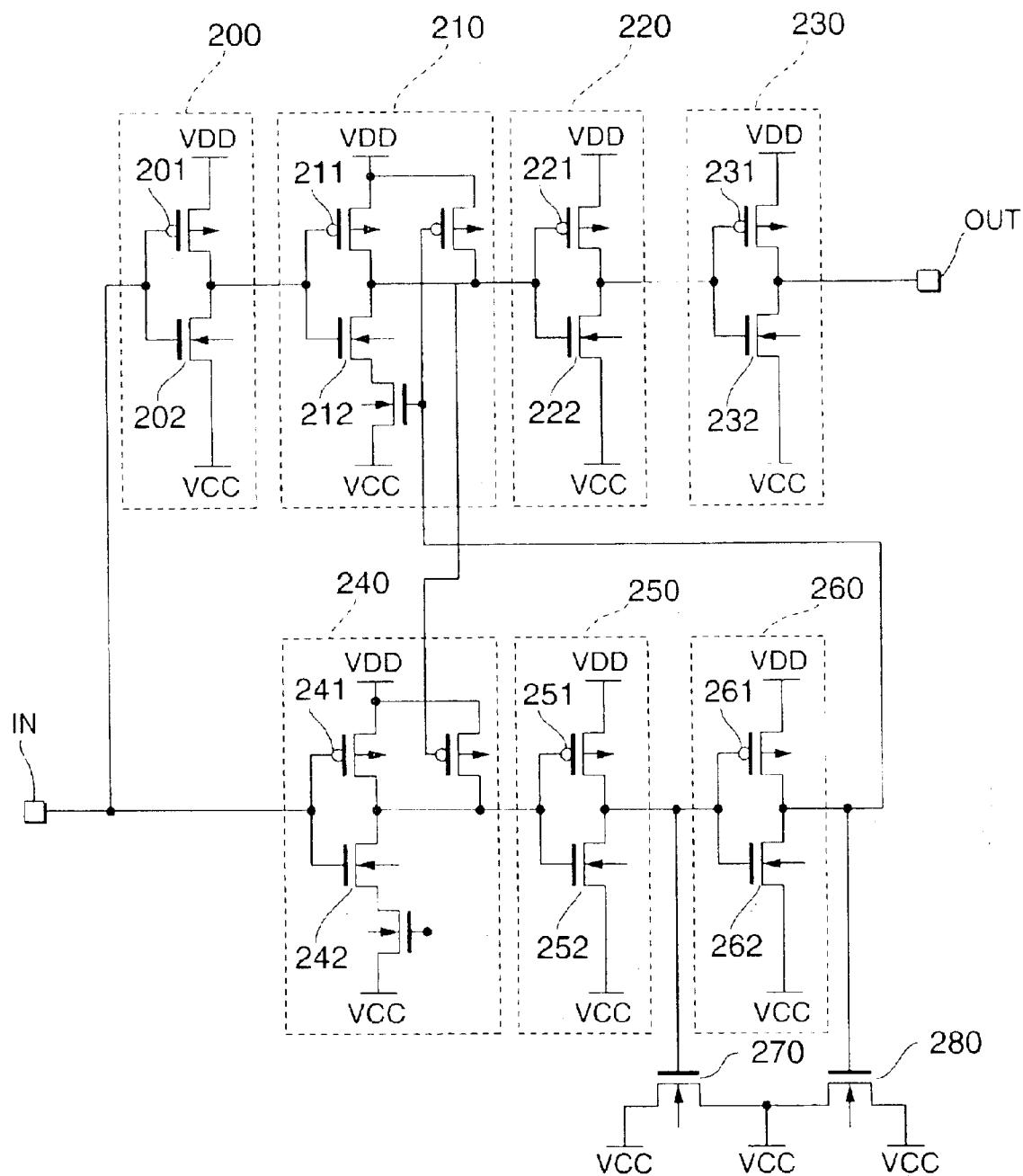
FIG. 11 is a circuit diagram showing the structure of delay adjusting circuit DLY2.
Figure 12:
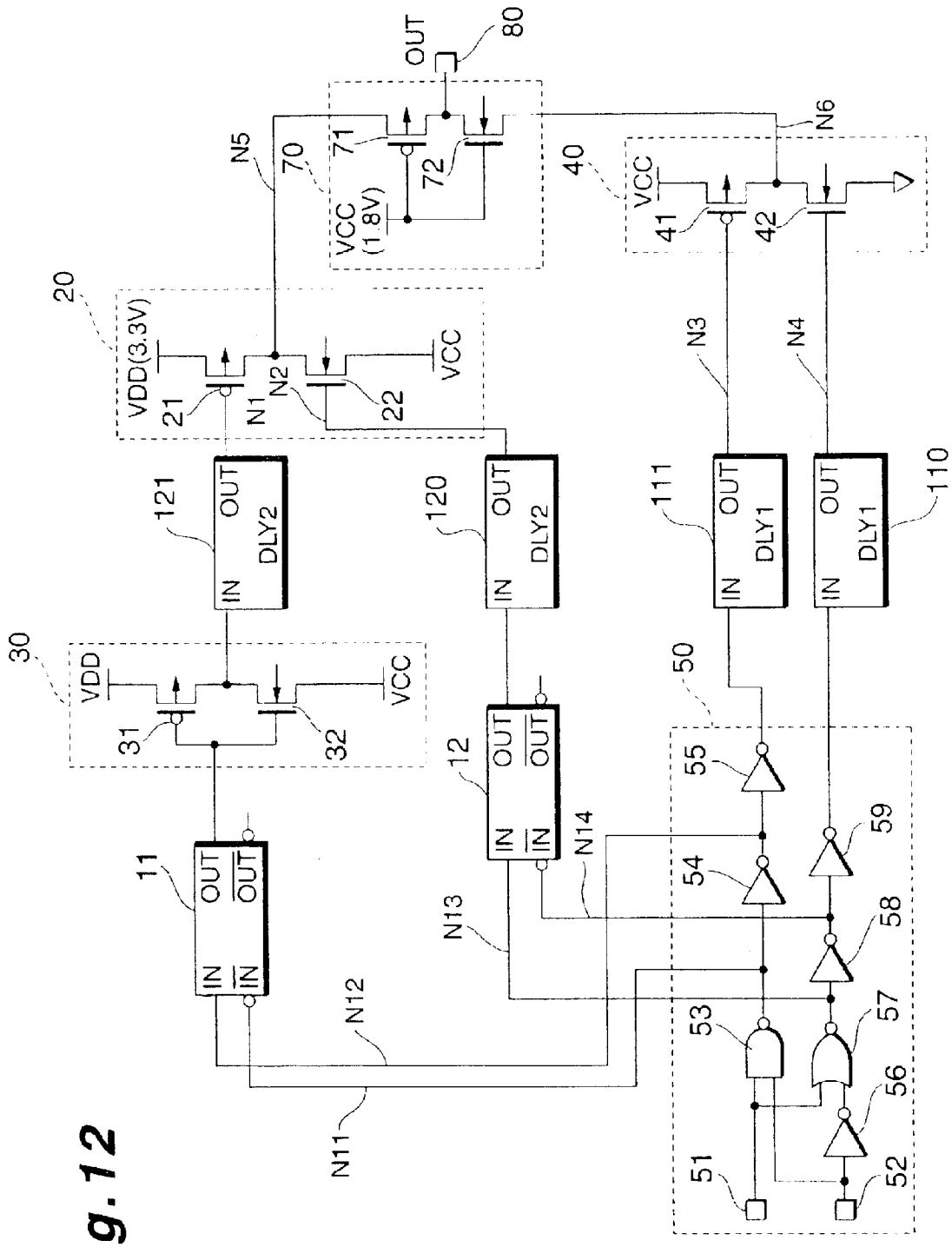
FIG. 12 is a circuit diagram showing an output circuit according to Embodiment 9.

FIG. 10 to 12 are circuit diagrams showing Embodiment 9. In these diagrams, elements common with FIG. 9 are designated with same the symbols.

Embodiment 9 comprises a delay adjusting circuit which is attached to the output circuit of Embodiment 8, so as to adjust timing of turning on or turning off of each transistor in main buffer circuit 20, 40. That is, in Embodiment 9 shown in FIG. 12, four delay adjusting circuits 110, 111, 121, 120 are inserted to prescribed portions of the output circuit the same as what is shown in FIG. 9. The delay adjusting circuit 110 is inserted between the output of inverter 59 of controlling circuit 50 and the gate of NMOS transistor 42 of main buffer circuit 40. The delay adjusting circuit 111 is inserted between the output of inverter 55 of controlling circuit 50 and the gate of PMOS transistor 41 of main buffer circuit 40. The delay adjusting circuit 121 is inserted between the output of pre-buffer circuit 30 and the gate of PMOS transistor 21 of main buffer circuit 20. The delay adjusting circuit 120 is inserted between the output OUT of level transforming circuit 12 and the gate of NMOS transistor 22 of main buffer circuit 20.

The delay adjusting circuits 110, 111 have same structure, which is designated with DLY1, and this is shown in FIG. 10.

An input IN is connected with an inverter 81 and with the first input of NOR circuit 81. The output of inverter 81 is connected with the first input of NOR circuit 82. The output of NOR circuit 82 is connected with an input of an inverter 83 and with the second input of NOR circuit 85. The output of NOR circuit 85 is connected with an input of a delay circuit comprising inverters 86, 87, and NMOS transistors 88, 89, and the output of this delay circuit is connected with the second input of NOR circuit 82. The output of inverter 83 is connected with input of an inverter 84, and the output of the inverter 84 is connected with an output OUT. Each inverter or NOR circuit mentioned above operates with an electricity source voltage of the low voltage level VCC and the ground level 0V. The source and drain of NMOS transistors 88, 89 are connected with the ground level. NMOS transistor 88 functions as a load to the inverter 86. NMOS transistor 89 functions as a load to the inverter 87, and this increases the delay time.

The delay adjusting circuits 121, 120 have the same structure, which is designated with DLY2, and this is shown in FIG. 11.

An input IN is a signal having amplitude between the high voltage level VDD and the low voltage level VCC, which is connected with an inverter 200 and with the first input of NAND circuit 240. The output of inverter 200 is connected with the first input of NAND circuit 210. The output of NAND circuit 210 is connected with input of an inverter 220 and with the second input of NAND circuit 240. The output of NAND circuit 240 is connected with input of a delay circuit comprising inverters 250, 260, and NMOS transistors 270, 280, and the output of this delay circuit is connected with the second input of NAND circuit 210. The output of inverter 220 is connected with input of an inverter 230, and the output of the inverter 230 is connected with an output OUT. Each inverter or NAND circuit mentioned above operates with an electricity source voltage of the low voltage level VCC and the ground level 0V. The source and drain of NMOS transistors 270, 280 are connected with the low voltage level VCC. NMOS transistor 270 functions as a load to the inverter 250. NMOS transistor 280 functions as a load to the inverter 260, and this increases the delay time.

<Operation of Embodiment 9>

Operation of the delay adjusting circuit DLY1 of FIG. 10 is described. First of all, when the input IN is the ground level 0V, the output of NOR circuit 82 becomes the ground level 0V by the inverter 81. The output of NOR circuit 85 becomes the low voltage level VCC because both inputs of NOR circuit 85 are ground level 0V. Therefore, both inputs of NOR circuit 82 becomes the low voltage level VCC by way of inverter 86, 87, and the signal of input IN is latched. The output OUT becomes the ground level 0V by way of inverter 83, 84.

Next, when the input IN becomes the low voltage level VCC from the ground level 0V, the output of NOR circuit 85 becomes the ground level 0V, and the output of inverter 81 becomes the ground level 0V. NOR circuit 82 outputs the low voltage level VCC, after it is inputted with delayed signal by way of inverter 86, 87. The output OUT becomes the low voltage level VCC by way of inverter 83, 84.

Next, when the input IN becomes the ground level 0V from the low voltage level VCC, the output of inverter 81 becomes the low voltage level VCC, and the output of NOR circuit 82 becomes the ground level 0V. The output OUT becomes the ground level 0V by way of inverter 83, 84. NOR circuit 85 becomes the low voltage level VCC by receiving the output of NOR circuit 82. Therefore, this circuit operates as a delay adjusting circuit, whose delay time of falling edge is early, and whose delay time of rising edge is late.

Operation of the delay adjusting circuit DLY2 of FIG. 11 is described. First of all, when the input IN is the low voltage level VCC, the output of inverter 200 becomes the high voltage level VDD. The output of NAND circuit 240 becomes the high voltage level VDD. Both inputs of NAND circuit 210 becomes the high voltage level VDD by way of inverter 250, 260. The output of NAND circuit 210 becomes the low voltage level VCC, because both inputs of NAND circuit 210 are high voltage level VDD. Therefore, both inputs of NAND circuit 240 become low voltage level VCC, and the signal of input IN is latched. The output OUT becomes the low voltage level VCC by way of inverter 220, 230.

Next, when the input IN becomes the high voltage level VDD from the low voltage level VCC, the output of inverter 210 becomes the low voltage level VCC, and the output of NAND circuit 210 becomes the high voltage level VDD. The is output OUT becomes the high voltage level VDD by way of inverter 220, 230. NAND circuit 240 becomes the low voltage level VCC by receiving the output of NAND circuit 210.

Next, when the input IN becomes the low voltage level VCC from the high voltage level VDD, the output of NAND circuit 240 becomes the high voltage level VDD, and the output of inverter 200 becomes the high voltage level VDD. NAND circuit 210 outputs the low voltage level VCC, after it is inputted with delayed signal by way of inverter inverter 250, 260. The output OUT becomes the low voltage level by way of inverter 220, 230. Therefore, this circuit operates as a delay adjusting circuit, whose delay time of falling edge is late, and whose delay time of rising edge is early.

Next, operation of the output circuit of FIG. 12 is described. The operation is almost same as that of the circuit shown in FIG. 9. Thus, the difference which occurs as the delay adjusting circuit is attached is described.

When the input data terminal 51 is the ground level 0V and the enable terminal is the low voltage level VCC, the nodes N1, N2, N3, N4 are the high voltage level VDD, high voltage level VDD, low voltage level VCC, and low voltage level VCC respectively. Next, when the input data terminal 51 becomes the low voltage level VCC from the high voltage level VDD, the node N4 of the output of delay adjusting circuit 110 and the node N3 of the output of delay adjusting circuit 111 become the ground level 0V respectively, because the delay time of falling edge of delay adjusting circuit DLY1 is set advanced. After this, the node N2 of the output of delay adjusting circuit 120 and the node N1 of the output of delay adjusting circuit 121 become the low voltage level VCC respectively, because the delay time of falling edge of delay adjusting circuit DLY2 is set retarded. Therefore, NMOS transistor 22 of main buffer circuit 20 turns on and PMOS transistor 21 of main buffer circuit 20 turns off, after NMOS transistor 42 of main buffer 40 turns off and PMOS transistor 41 of main buffer 40 turns on. Then, the output OUT becomes the high voltage level VDD.

Next, when the input data terminal 51 becomes the ground level 0V from the low voltage level VCC, the node N2 of the output of delay adjusting circuit 120 and the node N1 of the output of delay adjusting circuit 121 become the high voltage level VDD respectively, because the delay time of rising edge of delay adjusting circuit DLY2 is set advanced. After this, the node N4 of the output of delay adjusting circuit 110 and the node N3 of the output of delay adjusting circuit 111 become the low voltage level VCC respectively, because the delay time of rising edge of delay adjusting circuit DLY1 is set retarded. Therefore, NMOS transistor 42 of main buffer 40 turns off and PMOS transistor 41 of main buffer 40 turns on, after PMOS transistor 21 of main buffer circuit 20 turns off and NMOS transistor 22 of main buffer circuit 20 turns on. Then, the output OUT becomes the ground level 0V.

<Effect of Embodiment 9>

According to Embodiment 9, current passing by way of transistors 21, 71, 72, 42 can be decreased, because timings of turning on and turning off of transistors in the output stage are adjusted adequately. Therefore, it is possible to realize an output circuit with lower electricity consumption.

<Other Embodiments>

As mentioned above, preferred Embodiments of the semiconductor output circuit according to present invention are described. However, the present invention is not limited to these Embodiments. Simple alternation or modification performed by persons of ordinary skill is intended to be included in the scope of the claims.

For example, in Embodiments mentioned above, the main buffer circuit 20, 40 comprise CMOS inverter circuits respectively. However, the present invention is not limited to this. That is, it is possible to replace the main buffer circuit 20 of FIG. 1 with NAND circuit 20 able to operate by an electricity source of voltage between the high voltage level VDD and low voltage level VCC, and to replace the main buffer circuit 40 of FIG. 1 with NAND circuit 40 able to operate by an electricity source of voltage between the low voltage level VCC and ground level 0V; so that fixing signals for fixing the output level and transformed signals of the fixing signals are inputted to NAND circuit 20, 40 respectively. As the fixing signal of NAND circuit 20 is set to the ground level 0V, the node N5 becomes the high voltage level VDD, and as the fixing signal of NAND circuit 40 is set to the ground level 0V, the node N6 becomes the low voltage level VCC. Then, the output OUT is set to the high voltage level VDD. Thus, it becomes easy to set output level in the occasion of testing the output circuit. Incidentally, in this occasion, if the fixing signals are set to the low voltage level VCC respectively, the modified output circuit is the same as the output circuit of Embodiment 1 shown in FIG. 1. That is, the main buffer circuit 20 is regarded as a logic circuit outputting a signal having amplitude between the high voltage level VDD and the low voltage level VCC, and the main buffer circuit 40 is regarded as a logic circuit outputting signal having amplitude between the low voltage level VCC and the ground level 0V. Then, these signals are provided to the overvoltage protecting circuit 70.

Moreover, the pre-buffer circuit 30 and the inverter 55, 59 of controlling circuit 50 are circuits for driving the main buffer circuit 20 and 40. So, these circuits can be omitted, or further, the same kind of circuits can be added.

In Embodiment 5 to 9, described is a circuit structure inputting output signal of CMOS circuit 50 to level transforming circuit 11, 12. However, CMOS circuit 50 can be modified to a pre-buffer circuit other than the pre-buffer circuit 30, which is inputted with transformed data signal and with transformed enable signal respectively, so as to drive the main buffer circuit 20. This modification does not deteriorate the operation of output circuit.

Moreover, the low voltage electricity source connected with MOS transistors can be connected with individual different low voltage electricity sources or bias circuits, and turning on resistance of each transistor is adjusted. Then, it becomes possible to freely set gate width or gate length individually.

As described above, two electricity source of 3V and 1.8V are used in Embodiments mentioned above. However, the dielectric strength of gate oxide film will become an extent of 1.3V in device of 0.1 μm age. In this occasion, it is possible to apply the present invention to an output circuit with an electricity source combination of high voltage 1.8V and low voltage 1.0V.

What is claimed is:

1. A semiconductor integrated circuit comprising:
    a first controlling circuit section having input thereto an input signal having an amplitude between a low voltage and the ground, said first controlling circuit operating with an electricity source of the low voltage, said first controlling circuit outputting a first control signal generated by the input signal, outputting an inverse signal of the first control signal, and putting out a second control signal generated from the first control signal;
    a level transforming circuit having input thereto the first control signal and the inverse signal, and outputting a first signal having an amplitude between the low voltage and a high voltage higher than the low voltage;
    a first buffer circuit having input thereto the first p-channel type MOS transistor connected between the electricity source of the high voltage and a first output node, wherein a gate of said first p-channel type MOS transistor with the first supplied signal, said first buffer circuit having a first n-channel type MOS transistor connected between said first output node and the electricity source of the low voltage, which a gate of said first n-channel type MOS transistor is supplied with the first signal, and wherein said first buffer circuit outputs a second signal having an amplitude between the high voltage and the low voltage to said first output node;
    a second buffer circuit having a second p-channel type MOS transistor connected between the electricity source of the low voltage and a second output node, wherein a gate of said second p-channel type MOS transistor is supplied with the second control signal, and which has second n-channel type MOS transistor connected between said second output node and the ground, wherein a gate of said second n-channel type MOS transistor is supplied with the second control signal, and wherein said second buffer circuit outputs a third signal having an amplitude between the low voltage and the ground to said second output node; and
    an overvoltage protecting circuit having a drain of a third p-channel type MOS transistor connected with a third output node, wherein a source of said third p-channel type MOS transistor is supplied with the second signal, said overvoltage protecting circuit having a drain of the third n-channel type MOS transistor connected with third output node, wherein a source of said third n-channel type MOS transistor is supplied with the third signal, and wherein each gate of said third p-channel type MOS transistor and said third n-channel type MOS transistor is supplied with the low voltage in common, and wherein said overvoltage protecting circuit outputs a fourth signal having an amplitude between the high voltage and the ground to said third output node.

2. A semiconductor integrated circuit according to claim 1, further comprising
    a pre-buffer circuit connected with the output of said level transforming circuit, wherein said pre-buffer circuit outputs the first signal having an amplitude between the high voltage and the low voltage.

3. A semiconductor integrated circuit according to claim 2, wherein
    said pre-buffer circuit adjusts a timing of inputting said first buffer circuit with the first signal.

4. A semiconductor integrated circuit according to claim 1,
- wherein a turning on resistance of said first p-channel type MOS transistor in said first buffer circuit is set higher than a turning on resistance of said third p-channel type MOS transistor, and
- wherein a turning on resistance of said second n-channel type MOS transistor in said second buffer circuit is set higher than turning on resistance of said third n-channel type MOS transistor in said overvoltage protecting circuit.

5. A semiconductor integrated circuit according to claim 1,
- wherein a substrate of said first n-channel type MOS transistor in said first buffer circuit is connected with source of said first n-channel type MOS transistor, and a substrate of said third n-channel type MOS transistor in said overvoltage protecting circuit is connected with said source of said third n-channel type MOS transistor,
- wherein said substrate of said first n-channel type MOS trannsistor and said substrate of said third n-channel type MOS transistor are isolated from a from substrate of said second n-channel type MOS transistor.

6. A semiconductor integrated circuit according to claim 1,
- wherein a substrate of said third p-channel type MOS transistor is connected with said source of said third p-channel type MOS transistor, and is isolated from substrates of said first and second p-channel type MOS transistors.

7. A semiconductor integrated circuit according to claim 1,
- wherein said p-channel type MOS transistors and said n-channel type MOS transistors are formed on an active region isolated by an insulating film.

8. A semiconductor integrated circuit comprising:
- a first controlling circuit section having input thereto a data input signal having an amplitude between a low voltage and the ground, and having input thereto an enable signal, said first controlling circuit operating with an electricity source of the low voltage, said first controlling circuit outputting a first control signal generated by said data input signal and said enable signal, outputting a first inverse signal of the first control signal, outputting a second control signal generated by the data input signal and the enable signal, outputting a second inverse signal of the second control signal, outputting a third control signal generated from the first control signal, and outputting a fourth control signal generated from the second control signal;
- a first level transforming circuit having input thereto the first control signal and the first inverse signal, and outputting a first signal having an amplitude between the low voltage and high voltage higher than the low voltage;
- a second level transforming circuit having input thereto the second control signal and the second inverse signal, and outputting a second signal having an amplitude between the low voltage and a high voltage higher than the low voltage;
- a first buffer circuit having a first p-channel type MOS transistor gate of said first p-channel type MOS transistor supplied with the first signal, said first p-channel type MOS transistor connected between the electricity source of the high voltage and a first output node, said first buffer circuit having a first n-channel type MOS transistor gate of said first n-channel type MOS transistor supplied with the second signal, said first n-channel type MOS transistor connected between said first output node and the electricity source of the low voltage, and wherein said first buffer circuit outputs a third signal having an amplitude between the high voltage and the low voltage to said first output node;
- a second buffer circuit having a second p-channel type MOS transistor gate of said second p-channel type MOS transistor supplied with the third control signal, said second p-channel type MOS transistor connected between the electricity source of the low voltage and a second output node, saidsecond buffer circuit having a second n-channel type MOS transistor gate of said second n-channel type MOS transistor supplied with the fourth control signal, said second n-channel type MOS transistor connected between said second output node and the ground, and wherein said second buffer circuit outputs a fourth signal having an amplitude between the low voltage and the ground to said second output node; and
- an overvoltage protecting circuit having third p-channel type MOS transistor source of said third p-channel type MOS transistor supplied with the third signal, wherein a drain of said third p-channel type MOS transistor is connected with a third output node, said overvoltage protecting circuit having a third n-channel type MOS transistor source of said third n-channel type MOS transistor supplied with the fourth signal, wherein a drain of said third n-channel type MOS transistor is connected with said third output node, wherein each gate of said third p-channel type MOS transistor and said third n-channel type MOS transistor is supplied with the low voltage in common, and wherein said overvoltage protecting circuit fifth signal having an amplitude between the high voltage and the ground to said third output node.

9. A semiconductor integrated circuit according to claim 8,
- further comprising a pre-buffer circuit connected with the output of said first level transforming circuit, wherein said pre-bufer circuit outputs the first signal having an amplitude between the high voltage and the low voltage.

10. A semiconductor integrated circuit according to claim 9,
- wherein said pre-buffer circuit adjusts a timing of inputting said first buffer circuit with the first signal.

11. A semiconductor integrated circuit according to claim 8,
- wherein a turning on resistance of said first p-channel type MOS transistor in said first buffer circuit is set higher than a turning on resistance of said third p-channel type MOS transistor, and
- wherein a turning on resistance of said second n-channel type MOS transistor in said second buffer circuit is set higher than a turning on resistance of said third n-channel type MOS transistor in said overvoltage protecting circuit.

12. A semiconductor integrated circuit according to claim 8,
- wherein a substrate of said first n-channel type MOS transistor in said first buffer circuit is connected with source of said first n-channel type MOS transistor, and a substrate of said third n-channel type MOS transistor in said overvoltage protecting circuit is connected with said source of said third n-channel type MOS transistor, wherein said substrate of said first n-channel type MOS transistor and said substrate of said third n-channel type MOS transistor are isolated from a substrate of said second n-channel type MOS transistor.

13. A semiconductor integrated circuit according to claim 8, wherein a substrate of said third p-channel type MOS transistor is connected with said source of said third p-channel type MOS transistor, and is isolated from substrates of said first and second p-channel type MOS transistors.

14. A semiconductor integrated circuit according to claim 8, wherein said p-channel type MOS transistors and said n-channel type MOS transistors are formed on an active region isolated by an insulating film.

* * * * *